United States Patent
Takashima et al.

(12) 
(10) Patent No.: US 6,830,861 B2
(45) Date of Patent: Dec. 14, 2004

(54) PHOTOPOLYMERIZABLE COMPOSITION AND RECORDING MATERIAL

(75) Inventors: Masanobu Takashima, Shizuoka-ken (JP); Yuuichi Fukushige, Shizuoka-ken (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 63 days.

(21) Appl. No.: 10/060,131

(22) Filed: Feb. 1, 2002

(65) Prior Publication Data

US 2002/0142244 A1 Oct. 3, 2002

(30) Foreign Application Priority Data

Feb. 1, 2001 (JP) .......................... 2001-025900

(51) Int. Cl.[7] .................... G03F 7/031; G03F 7/032
(52) U.S. Cl. .............. 430/138; 430/270.1; 430/280.1; 430/281.1; 430/284.1; 430/286.1
(58) Field of Search .................. 430/138, 270.1, 430/280.1, 281.1, 284.1, 286.1

(56) References Cited

U.S. PATENT DOCUMENTS

| | | | |
|---|---|---|---|
| 3,925,085 A | * 12/1975 | Sato et al. ................ 430/567 |
| 4,307,182 A | 12/1981 | Dalzell et al. | |
| 4,772,541 A | 9/1988 | Gottschalk et al. | |
| 4,952,480 A | 8/1990 | Yamaguchi et al. | |
| 4,971,891 A | * 11/1990 | Kawamura et al. ...... 430/278.1 |
| 6,011,180 A | 1/2000 | Cunningham et al. | |
| 6,022,664 A | 2/2000 | Washizu et al. | |
| 2002/0168494 A1 | * 11/2002 | Nagata et al. ............. 428/64.2 |

FOREIGN PATENT DOCUMENTS

JP  2002023295 A * 1/2002 ............ G03C/1/12

OTHER PUBLICATIONS

JP 2002023295 A, machine translation of examples and claims.*

* cited by examiner

*Primary Examiner*—Yvette C. Thornton
(74) *Attorney, Agent, or Firm*—Sughrue Mion, PLLC

(57) ABSTRACT

A photopolymerizable composition that is highly sensitive not only to ultraviolet light, but also light in the range from visible light to infrared light, and a recording material containing the photopolymerizable composition, which is excellent in sensitivity and decolorization property in the background part, and which is capable of forming sharp images with high contrast. The photopolymerizable composition contains a polymerizable compound having an ethylenic unsaturated bond and a radical generator capable of forming a radical by the action of the compound and the radical generator upon each other.

20 Claims, No Drawings

PHOTOPOLYMERIZABLE COMPOSITION AND RECORDING MATERIAL

BACKGROUND OF THE INVENTION

1. Field of the Invention

The present invention relates to a novel photopolymerizable composition and a novel recording material. More particularly, it relates to a photopolymerizable composition and a recording material that can be suitably used in various fields including inks, color filters, holograms, proofs, sealants, adhesives, lithographic printing, resin relief printing and photoresists.

2. Description of the Related Art

A photopolymerizable composition basically contains a photopolymerization initiator and a compound having two or more ethylenic unsaturated bonds that can be addition-polymerized (hereinafter referred to as a "polyfunctional monomer"). The photopolymerizable composition is hardened upon irradiation with light to change the cohesiveness thereof, and becomes insoluble in solvents. By utilizing this property, the photopolymerizable composition is widely used in photography, printing, surface treatment of metals, and inks. The functions and applications of the photopolymerizable composition have been described in various publications.

For example, details thereof have been described by J. Koser in "Light Sensitive Systems", pp. 158 to 193 (J. Wiley & Sons, New York, 1965) and by K. I. Jacobson and R. E. Jacobson in "Imaging Systems", pp. 181 to 222 (J. Wiley & Sons, New York, 1976).

In recent years, an image forming system utilizing photosensitive microcapsules containing therein a photopolymerizable composition has been proposed as an image forming process utilizing a photopolymerizable composition. For example, JP-A-57-124343, JP-A-57-179836 and JP-A-57-197538 disclose such a process in which a coloring sheet coated with a photopolymerizable composition containing a vinyl compound and a photopolymerization initiator and microcapsules containing a dye is exposed and then superposed on a image receiving sheet, and then pressure is applied, so as to form a dye image.

JP-A-3-87827 and JP-A-4-211252 disclose a light and heat sensitive coloring recording material containing two components that are electron donating and electron accepting, respectively. They disclose a recording material, in which one of the two components is contained in microcapsules, and the other is a hardening compound of a photocuring composition which is a recording material. The second component may also be contained in the microcapsules as well as in the photocuring composition. In the recording material, described hereinafter, such a light and heat sensitive recording material is exemplified that has a layer containing microcapsules containing an electron donating colorless dye, and further contains, outside the microcapsules, a photocuring composition containing an electron accepting compound, a polymerizable vinyl monomer and a photopolymerization initiator.

As described in the foregoing, a recording material utilizing a photopolymerizable composition can attain image recording in a completely dry system without the use of a developing solution, and therefore it is particularly preferred in view of environmental protection because no waste is generated.

It is advantageous in the case where image recording is carried out on a photosensitive recording material that an infrared laser and blue to red light, which are inexpensive, can be utilized in addition to ultraviolet light and visible light having short wavelengths. However, a recording material utilizing a photopolymerizable composition is sensitive to ultraviolet light, but most of them are not sensitive to light in the visible to infrared region, or have insufficient sensitivity in the case where they are sensitive. As a result, an image thus formed is blurred, and the contrast between the image part and the non-image part is low. Therefore, there is a demand for the recording material utilizing a photopolymerizable composition in which the sensitivity upon image recording with light in the visible to infrared region is further increased.

These recording materials generally contain a spectral sensitizing dye for increasing the sensitivity to light used for image recording (writing). However, because a spectral sensitizing dye has a hue, it is necessary that after obtaining an image thus recorded, the recording material is irradiated with light that can be absorbed by the dye to photodecompose the dye, whereby the color present on the recording material is erased. When the decolorization is insufficient, deterioration in sharpness of hues and contrast occurs due to residual color in portions. Furthermore, such a problem arises that the decolorization requires a long period of time. Therefore, further improvement of the spectral sensitizing dye has been demanded.

SUMMARY OF THE INVENTION

The invention has been developed to solve the problems associated with the conventional art.

An object of the invention is to provide a photopolymerizable composition that is highly sensitive not only to ultraviolet light, but also to light in the range from visible light to infrared light.

Another object of the invention is to provide such a recording material for a completely dry treatment system which generates no waste and is capable of carrying out image recording with high sensitivity by using not only ultraviolet light but also light in the range from visible light to infrared light, is excellent in decolorization of the non-image part (the background part), and is capable of forming a monochrome or color image with sharpness and high contrast.

The foregoing objects of the invention will be attained by the following aspects of the invention.

The invention relates to, as a first aspect, a photopolymerizable composition comprising a polymerizable compound having an ethylenic unsaturated bond, a compound represented by the following general formula (I), and a radical generator capable of forming a radical by the action of said compound and said radical generator upon each other:

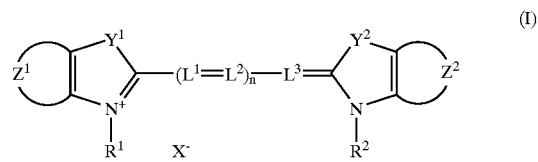

wherein $R^1$ and $R^2$ each independently represents an aliphatic group or an aromatic group; $Y^1$ and $Y^2$ each independently represents a sulfur atom, an oxygen atom, $C(R^3)R^4$, a selenium atom or a tellurium atom, and $R^3$ and $R^4$ each independently represents a hydrogen atom, an aliphatic group or an aromatic group, provided that $R^3$ and $R^4$ are atomic groups which form a ring by bonding with each other. The aliphatic group and the aromatic group are defined in the same way as the aliphatic group and the aromatic group represented by $R^1$ or $R^2$ in the general formula (I); $Z^1$ represents an atomic group forming an aromatic heterocyclic ring or an aromatic ring formed by condensation of heterocyclic rings, wherein the heterocyclic ring may have a substituent; $Z^2$ represents an atomic group forming an aromatic ring or a heterocyclic ring, wherein the aromatic ring and the heterocyclic ring each may have a substituent; $L^1$, $L^2$ and $L^3$ each independently represents a methine group which may or may not have a substituent, wherein when $L^1$, $L^2$ and $L^3$ each is a methine group having a substituent, the substituents may bond to form an unsaturated aliphatic ring or an unsaturated heterocyclic ring; n represents 0, 1, 2 or 3; and $X^-$ represents a group capable of forming an anion.

The radical generator is preferably an organic boron compound, and the organic boron compound is preferably a compound represented by the following general formula (A):

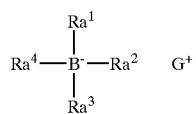

(A)

Wherein $R_a^1$, $R_a^2$, $R_a^3$ and $R_a^4$ each independently represents an aliphatic group, an aromatic group, a heterocyclic group or $Si(R_a^5)(R_a^6)$—$R_a^7$, wherein $R_a^5$, $R_a^6$ and $R_a^7$ each independently represents an aliphatic group or an aromatic group; and $G^+$ represents a group capable of forming a cation.

The invention relates to, as a second aspect, a recording material comprising a support having thereon a recording layer, the recording layer at least comprising a color forming component A, a color forming component B having a site that causes the coloring component A to form color upon reacting therewith, and the photopolymerizable composition of the invention.

At least one of the polymerizable compounds having an ethylenic unsaturated bond may be the color forming component B, and the polymerizable compound having an ethylenic unsaturated bond maybe a color-formation suppressing compound having, in the same molecule, a site that suppresses the reaction between the color forming component A and the color forming component B. The color forming component A may be contained in microcapsules.

Furthermore, the recording layer may have a multi-layer structure comprising i pieces of recording layers containing from a first recording layer that is sensitive to light having a center wavelength $\lambda_1$ and a second recording layer that is sensitive to light having a center wavelength $\lambda_2$ and forms a color different from that of the first recording layer to the i-th recording layer that is sensitive to light having a center wavelength $\lambda_i$ and forms a color different from those of the first to (i-1)th recording layers.

DESCRIPTION OF THE PREFERRED EMBODIMENTS

The photopolymerizable composition of the invention contains the compound represented by the general formula (I), which is a spectral sensitizing dye, and the compound and the radical generator act upon each other. In the recording material of the invention, the recording layer formed on the support contains the photopolymerizable composition of the invention along with the color forming components and other components.

The photopolymerizable composition of the invention will be described below. Details of the recording material also will be apparent from the description.

Photopolymerizable Composition

The photopolymerizable composition of the invention contains the polymerizable compound having an ethylenic unsaturated bond, the compound represented by the general formula (I), and the radical generator capable of forming a radical by said radical generator and the compound acting upon each other, and may further contain other component in accordance with necessity.

Polymerizable Compound Having Ethylenic Unsaturated Bond

The photopolymerizable composition of the invention contains the polymerizable compound having an ethylenic unsaturated bond (hereinafter sometimes referred to as a "polymerizable compound").

The polymerizable compound is a polymerizable compound that has, in the molecule thereof, at least one ethylenic unsaturated bond. The polymerizable compound is not particularly limited and may be appropriately selected in accordance with the purpose. Examples thereof include an acrylic acid derivative, such as an acrylate and an acrylamide, acrylic acid and a salt thereof, a methacrylic acid derivative, such as a methacrylate and a methacrylamide, methacrylic acid and a salt thereof, maleic anhydride, a maleate, itaconic acid, an itaconate, a styrene compound, a vinyl ether, a vinyl ester, an N-vinyl heterocyclic compound, an allyl ether and an allyl ester.

The polymerizable compound contains one of or two or more olefinic double bonds, and may be either a monomer or an oligomer.

Examples of the monomer include an alkyl or hydroxyalkyl acrylate or methacrylate, such as methyl acrylate, ethyl acrylate, butyl arcrylate, 2-ethylhexyl acrylate, 2-hydroxyethyl acrylate, isobornyl acrylate, methyl methacrylate and ethyl methacrylate. A silicone acrylate is also useful.

Other examples of the monomer include acrylonitrile, acrylamide, methacrylamide, N-substituted (meth) acrylamide, a vinyl ester, such as vinyl acetate, a vinyl ether, such as isobutyl vinyl ether, styrene, an alkylstyrene, a halostyrene, N-vinylpirrolidone, vinyl chloride and vinylidene chloride.

Examples of the monomer that contains two or more of double bonds include ethylene glycol, propylene glycol, neopentyl glycol, hexamethylene glycol, a diacrylate, which is an ester with bisphenol A and the like, 4,4'-bis(2-acryloyloxyethoxy)diphenylpropane, trimethylopropane triacrylate, pentaerythritol triacrylate or tetraacrylate, vinyl acrylate, divinylbenzene, divinyl succinate, diallyl phthalate, triallyl phosphate, triallyl isocyanurate and tris(2-acryloylethyl) isocyanurate.

Examples of a polyunsaturated compound of the oligomer include an epoxy resin having a (meth) acrylic group, polyester having a (meth)acrylic group, polyester containing a vinyl ether and an epoxy group, polyurethane containing a vinyl ether and an epoxy group, and polyether containing a vinyl ether and an epoxy group. Examples of the unsaturated oligomer include an unsaturated polyester resin that is generally produced from maleic acid, phthalic acid and at least one diol and has a molecular weight of about from 500 to 3,000. Furthermore, usable examples thereof include a vinyl ether monomer or oligomer, polyester, polyurethane, polyether, polyvinyl ether and an oligomer terminating with maleate that has an epoxy main chain. Particularly suitable examples include a combination of an oligomer having a vinyl ether group and a polymer disclosed in WO 90/01512. A copolymer of vinyl ether and a monomer functionalized with maleic acid is also suitable. The unsaturated oligomers are included in prepolymers.

Especially suitable examples include an ester of polyol or polyepoxide and an ethylenic unsaturated carboxylic acid, a polymer having an ethylenic unsaturated group on a main chain or a side chain, such as unsaturated polyester, polyamide, polyurethane and copolymers thereof, an alkyd resin, polybutadiene, a butadiene copolymer, polyisoprene, an isoprene copolymer, a polymer or a copolymer containing a (meth)acrylic group on a side chain, and a mixture containing at least one of these polymers.

Examples of the unsaturated carboxylic acid include acrylic acid, methacrylic acid, crotonic acid, itaconic acid, cinnamic acid and an unsaturated fatty acid, such as linoleic acid and oleic acid. Among these, acrylic acid and methacrylic acid are preferred.

Suitable examples of the polyol include an aromatic polyol and, particularly aliphatic and alicyclic polyols. Examples of the aromatic polyol include hydroquinone, 4,4'-dihydroxydiphenyl, 2,2-di(4-hydroxyphenyl)propane, novolak and resorcin. Examples of the polyepoxide include those based on the foregoing polyols, particularly an aromatic polyol, and epichlorohydrin. Other suitable examples of the polyol include a polymer and a copolymer that contain a hydroxyl group on the polymer chain or the side chain. Examples thereof include polyvinyl alcohol and a copolymer thereof, and polyhydroxyalkyl methacrylate and a copolymer thereof. Further suitable examples of the polyol include an oligoester having a hydroxyl end group.

Preferred examples of the aliphatic and alicyclic polyols include an alkylenediol having from 2 to 12 carbon atoms. Examples thereof include ethylene glycol, 1,2- or 1,3-propanediol, 1,2-, 1,3- or 1,4-butanediol, pentanediol, hexanediol, octanediol, dodecanediol, diethylene glycol and triethylene glycol. Preferred examples thereof include polyethylene glycol having a molecular weight of from 200 to 1,500, 1,3-cyclopentanediol, 1,2-, 1,3- or 1,4-cyclohexanediol, 1,4-dihydroxymethylcyclohexane, glycerol, tris($\beta$-hydroxyethyl)amine, trimethylolethane, trimethylolpropane, pentaerythritol, dipentaerythritol and sorbitol.

The polyol may be partially or completely esterified with one kind or plural kinds of an unsaturated carboxylic acid. In the partially esterified polyol, the free hydroxyl group may be modified, for example, etherified or esterified with other carboxylic acids.

Examples of the ester include trimethylolpropane triacrylate, trimethylolethane triacrylate, trimethylolpropane trimethacrylate, trimethylolethane trimethacrylate, tetramethylene glycol dimethacrylate, triethylene glycol dimethacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethacrylate, pentaerythritol diitaconate, dipentaerythritol trisitaconate, dipentaerythritol pentaitaconate, dipentaerythritol hexaitaconate, ethylene glycol diacrylate, 1,3-butanediol diacrylate, 1,3-butanediol dimethacrylate, 1,4-butanediol diitaconate, sorbitol triacrylate, sorbitol tetraacrylate, pentaerythritol modified triacrylate, sorbitol tetramethacrylate, sorbitol pentaacrylate, sorbitol hexaacrylate, oligoester acrylate and methacrylate, glycerol diacrylate and triacrylate, 1,4-cyclohexane diacrylate, bisacrylate and bismethacrylate of polyethylene glycol having a molecular weight of from 200 to 1,500, and mixtures of them.

Suitable examples of the polymerizable compound include an amide of the same or different unsaturated carboxylic acids with an aromatic, alicyclic or aliphatic polyamine preferably having from 2 to 6, more preferably from 2 to 4, amino groups.

Examples of the polyamine include ethylenediamine, 1,2- or 1,3-propylenediamine, 1,2-, 1,3- or 1,4-butylenediamine, 1,5-pentylenediamine, 1,6-hexylenediamine, octylenediamine, dodecylenediamine, 1,4-diaminocyclohexane, isophoronediamine, phenylenediamine, bisphenylenediamine, di-$\beta$-aminoethyl ether, diethylenetriamine, triethylenetetramine and di($\beta$-aminoethoxy)- or di($\beta$-aminopropoxy)ethane. Additionally, preferred examples thereof include a polymer or a copolymer that further have an amino group on the side chain, and an oligoamide having an amino end group. Examples of the unsaturated amide include methylene bisacrylamide, 1,6-hexamethylene bisacrylamide, diethylenetriamine trismethacrylamide, bis(methacrylamidepropoxy)ethane, $\beta$-methacrylamideethyl methacrylate and N-(($\beta$-hydroxyethoxy)ethyl)acrylamide.

The suitable unsaturated polyester and polyamide are derived, for example, from maleic acid and a diol or a diamine. Part of the maleic acid may be replaced by other dicarboxylic acids. They may be used along with an ethylenic unsaturated comonomer, such as styrene. The polyester and polyamide can be derived from a dicarboxylic acid with an ethylenic unsaturated diol or diamine, particularly those having a relatively long chain, such as those having from 6 to 20 carbon atoms. Examples of the polyurethane include those constituted from a saturated or unsaturated diisocyanate and an unsaturated or saturated diol.

The polybutadiene, polyisoprene and a copolymer thereof have been known. Suitable examples of the comonomer include an olefin, such as ethylene, propene, butene and hexene, a (meth)acrylate, acrylonitrile, styrene and vinyl chloride. The polymer having a (meth)acrylate group on the side chain is also known. For example, the polymer can be obtained as a reaction product of an epoxy resin based on novolak and (meth)acrylic acid, or alternatively, it may be a homopolymer or a copolymer of vinyl alcohol or (meth) acrylic acid and a esterified hydroxyalkyl derivative thereof, or a homopolymer or a copolymer of a (meth)acrylate esterified with hydroxyalkyl (meth)acrylate.

The polymerizable compound may be such a compound that has a site which has another function in the structure thereof in accordance with the purpose of the photopolymerizable composition. For example, in the case where the photopolymerizable composition is used as a recording material, it may have a site which promotes a color forming reaction of a color forming component constituting the image part or a site which suppresses the color formation. These will be described in detail later.

The content of the polymerizable compound having an ethylenic unsaturated bond is generally from 10 to 99% by weight, and preferably from 30 to 95% by weight, based on the total weight of the photopolymerizable composition.

Compound Represented by General Formula (I)

The photopolymerizable composition of the invention contains the compound represented by the following general formula (I) as a spectral sensitizing dye. The dye is a cyanine dye and functions to spectrally sensitize the radical generator. Therefore, upon irradiation of visible to infrared light corresponding to the absorbance region of the dye, generation of radicals by the radical generator can be accelerated even if a radical generator having no absorbance in this region is contained. Furthermore, because the dye has high decolorization property upon irradiation with light, the dye is useful from the standpoint that the fog density of the background part is suppressed and thus a sharp image having a high contrast is obtained when the dye is used in a recording material using the photopolymerizable composition of the invention.

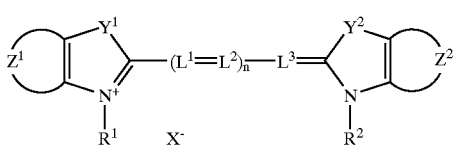

(I)

In the general formula (I), $R^1$ and $R^2$ each independently represents an aliphatic group or an aromatic group.

In the case where $R^1$ or $R^2$ represents an aliphatic group, examples of the aliphatic group include an alkyl group, a substituted alkyl group, an alkenyl group, a substituted alkenyl group, an alkynyl group, a substituted alkynyl group, aralkyl group and a substituted aralkyl group. Among these, an alkyl group, a substituted alkyl group, an alkenyl group, a substituted alkenyl group, an aralkyl group and a substituted aralkyl group are preferred, and an alkyl group and a substituted alkyl group are more preferred.

The aliphatic group may be either an alicyclic group or a linear aliphatic group. The linear aliphatic group may have a branch.

Examples of the alkyl group represented by $R^1$ or $R^2$ include a linear, branched or cyclic alkyl group, and the number of carbon atoms of the alkyl group is preferably from 1 to 30, and more preferably from 1 to 20. The range for the number of carbon atoms of the alkyl part of the substituted alkyl group is the same as above. The alkyl group may be either an alkyl group having a substituent or an unsubstituted alkyl group.

Examples of the alkyl group include a methyl group, an ethyl group, a propyl group, a butyl group, a pentyl group, a hexyl group, an octyl group, a 2-ethylhexyl group, a decyl group, a dodecyl group, an octadecyl group, a cyclohexyl group, a cyclopentyl group, a neopentyl group, an isopropyl group and an isobutyl group.

Examples of the substituent for the substituted alkyl group include a carboxyl group, a sulfo group, a cyano group, a halogen atom (such as a fluorine atom, a chlorine atom and a bromine atom), a hydroxyl group, an alkoxycarbonyl group having 30 or less carbon atoms (such as a methoxycarbonyl group, an ethoxycarbonyl group and a benzylcarbonyl group), an alkylsulfonylaminocarbonyl group having 30 or less carbon atoms, an arylsulfonylaminocarbonyl group, an alkylsulfonyl group, an arylsulfonyl group, an acylaminosulfonyl group having 30 or less carbon atoms, an alkoxy group having 30 or less carbon atoms (such as a methoxy group, an ethoxy group, a benzyloxy group, a phenoxyethoxy group and a phenethyloxy group), an alkylthio group having 30 or less carbon atoms (such as a methylthio group, an ethylthio group and a methylthioethylthioethyl group), an aryloxy group having 30 or less carbon atoms (such as a phenoxy group, a p-tolyloxy group, a 1-naphthoxy group and a 2-naphthoxy group), a nitro group, an alkyl group having 30 or less carbon atoms, an alkoxycarbonyloxy group, an aryloxycarbonyloxy group, an acyloxy group having 30 or less carbon atoms (such as an acetyloxy group and a propyonyloxy group), an acyl group having 30 or less carbon atoms (such as an acetyl group, a propyonyl group and a benzoyl group), a carbamoyl group (such as a carbamoyl group, an N,N-dimethylcarbamoyl group, a morpholinocarbonyl group and a piperidinocarbonyl group), a sulfamoyl group (such as a sulfamoyl group, N,N-dimethylsulfamoyl group, a morpholinosulfonyl group and a piperidinosulfonyl group), an aryl group having 30 or less carbon atoms (such as a phenyl group, a 4-chlorophenyl group, 4-methylphenyl group and an α-naphthyl group), a substituted amino group (such as an amino group, an alkylamino group, a dialkylamino group, an arylamino group, a diarylamino group and an acylamino group), a substituted ureido group, a substituted phosphono group and a heterocyclic group. A carboxyl group, a sulfo group, a hydroxyl group and a phosphono group herein may be in the form of a salt. Examples of a cation forming the salt include $G^+$ described later.

Examples of the alkenyl group represented by $R^1$ or $R^2$ include a linear, branched or cyclic alkenyl group, and the carbon number of the alkenyl group is preferably from 2 to 30, and more preferably from 2 to 20. The alkenyl group may be either a substituted alkenyl group or an unsubstituted alkenyl group, and the range of the carbon number of the alkenyl part of the substituted alkenyl group is the same as the case of the alkenyl group.

Examples of the substituent for the substituted alkenyl group include those exemplified for the substituted alkyl group.

Examples of the alkynyl group represented by $R^1$ or $R^2$ include a linear, branched or cyclic alkynyl group, and the carbon number of the alkynyl group is preferably from 2 to 30, and more preferably from 2 to 20. The alkynyl group may be either a substituted alkynyl group or an unsubstituted alkynyl group, and the range of the carbon number of the alkynyl part of the substituted alkynyl group is the same as the case of the alkynyl group.

Examples of the substituent for the substituted alkynyl group include those exemplified for the substituted alkyl group.

Examples of the aralkyl group represented by $R^1$ or $R^2$ include a linear, branched or cyclic aralkyl group, and the carbon number of the aralkyl group is preferably from 7 to 35, and more preferably from 7 to 25. The aralkyl group may be either a substituted aralkyl group or an unsubstituted aralkyl group, and the range of the carbon number of the aralkyl part of the substituted aralkyl group is the same as the case of the aralkyl group.

Examples of the substituent for the substituted aralkyl group include those exemplified for the substituted alkyl group.

In the case where $R^1$ or $R^2$ represents an aromatic group, examples of the aromatic group include an aryl group and a substituted aryl group. The carbon number of the aryl group is preferably from 6 to 30, and more preferably from 6 to 20. The range of the carbon number of the aryl part of the substituted aryl group is the same as the case of the aryl group. Examples of the aryl group include a phenyl group, an α-naphthyl group and a β-naphthyl group.

Examples of the substituent for the substituted aryl group include those exemplified for the substituted alkyl group.

In the general formula (I), $Y^1$ and $Y^2$ each independently represents a sulfur atom, an oxygen atom, $CR^3(R^4)$, a selenium atom or a tellurium atom, and $R^3$ and $R^4$ each independently represents a hydrogen atom, an aliphatic group or an aromatic group, provided that $R^3$ and $R^4$ are atomic groups which form a ring by bonding with each other. The aliphatic group and the aromatic group are defined in the same way as the aliphatic group and the aromatic group represented by $R^1$ or $R^2$ in the general formula (I), and an alkyl group and a substituted alkyl group are particularly preferred as the aliphatic group. $Y^1$ and $Y^2$ each is preferably an oxygen atom, a sulfur atom or $CR^3(R^4)$, and a sulfur atom and $CR^3(R^4)$ are more preferred. $R^3$ and $R^4$ each is preferably an alkyl group.

In the general formula (I), $Z^1$ represents an atomic group forming an aromatic heterocyclic ring or forming an aromatic ring by condensing heterocyclic rings, and the aromatic ring may be condensed with the heterocyclic ring. The heterocyclic ring and the aromatic ring condensed with the heterocyclic ring may have a substituent. Examples of the substituent include those exemplified for the substituted alkyl group described in the foregoing. Examples of the atomic group forming the heterocyclic ring include the following, and among these, a pyridine ring and a thiophene ring are preferred.

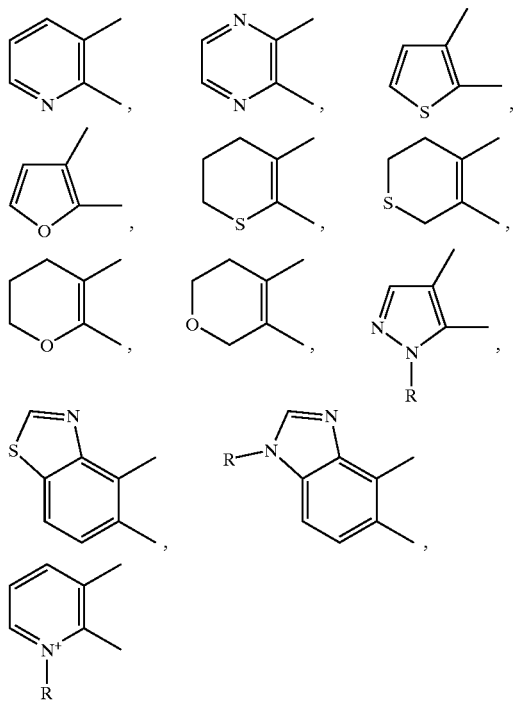

Wherein R represents a hydrogen atom, an aliphatic group or an aromatic group.

In the spectral sensitizing dye of the invention, it is preferred to introduce the atomic group represented by $Z^1$ into the general formula (I) because the sensitivity is increased in comparison to the case where a benzene ring is introduced.

In the general formula (I), $Z^2$ represents an atomic group forming an aromatic ring or a heterocyclic ring, wherein the aromatic ring and the heterocyclic ring each may have a substituent. Examples of the substituent include those exemplified for the substituted alkyl group described in the foregoing. Examples of the atomic group represented by $Z^2$ forming the heterocyclic ring include those exemplified for $Z^1$, and among these, a pyridine ring and a thiophene ring are preferred. Preferred examples of the atomic group represented by $Z^2$ forming the aromatic ring include a phenyl group and a naphthyl group.

It is preferred that $Z^1$ and $Z^2$ are the same because the compound represented by the general formula (I) can be easily produced.

In the general formula (I), $L^1$, $L^2$ and $L^3$ each independently represents a methine group, which may have a substituent, wherein when $L^1$, $L^2$ and $L^3$ each is a methine group having a substituent, the substituents may be combined to form an unsaturated aliphatic ring or an unsaturated heterocyclic ring.

Examples of the substituent for the methine group include a substituted amino group (such as an amino group, an alkylamino group, a dialkylamino group, an arylamino group, a diarylamino group and an acylamino group), a substituted oxy group (such as a hydroxyl group, an alkoxy group, an acyloxy group, an aryloxy group, an alkoxycarbonyloxy group and an aryloxycarbonyloxy group), a substituted mercapto group (such as an alkylmercapto group and an arylmercapto group), a halogen atom, an aliphatic group and an aromatic group.

Examples of the halogen atom include a fluorine atom, a bromine atom and a chlorine atom. The aliphatic group and the aromatic group are defined in the same way as the aliphatic group and the aromatic group represented by $R^1$. The substituent for the substituted amino group, the substituted oxy group and the substituted mercapto group is defined in the same way as the substituent for the substituted alkyl group represented by $R^1$.

Examples of the methine group represented by $L^1$, $L^2$ and $L^3$ include an unsubstituted methine group and a substituted methine group, and in the case where the methine group has a substituent, those substituted by a halogen atom or an aliphatic group and those having substituents bonded to form a cyclopentene ring or a cyclohexene ring are particularly preferred.

In the general formula (I), n represents 0, 1, 2 or 3.

In the general formula (I), $X^-$ represents a group capable of forming an anion. Examples of the anion include a halide ion (such as $Cl^-$, $B^-$ and $I^-$), a p-toluenesulfonate ion, an ethylsulfonate ion, a 1,5-disulfonaphthalene dianion, $PF_6^-$, $BF_4^-$ and $ClO_4^-$. $X^-$ may be a substituent substituted on any substitutable site on the cation part of the general formula (I), and in this case, the compound represented by the general formula (I) forms an internal salt.

Specific examples of the compound represented by the general formula (I) (example compounds) will be shown below, but the invention is not limited to the example compounds.

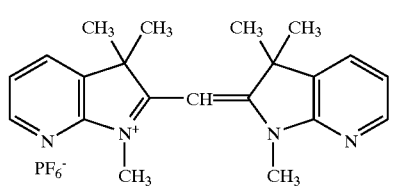

No. 1

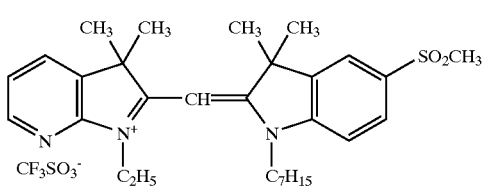

No. 2

-continued
No. 3
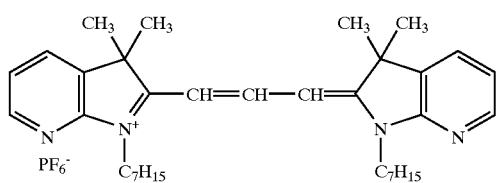
No. 4
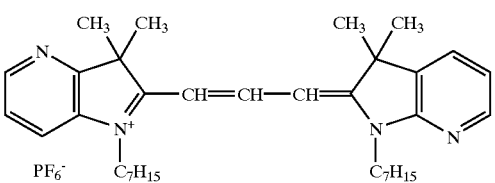
No. 5
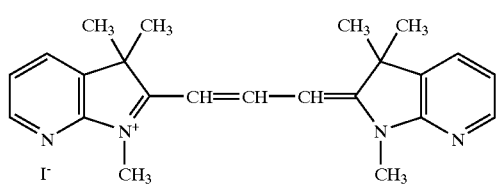
No. 6
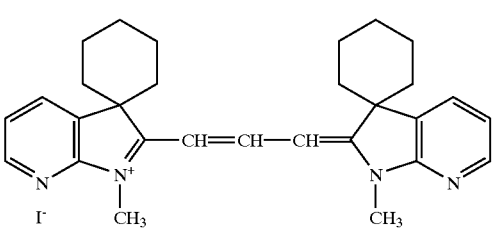
No. 7
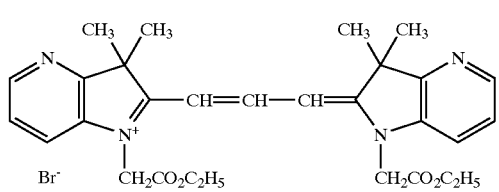
No. 8
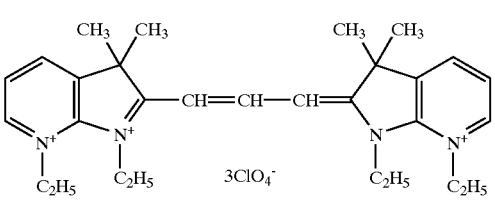
No. 9
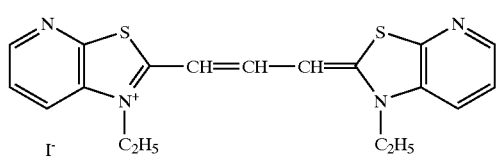
No. 10
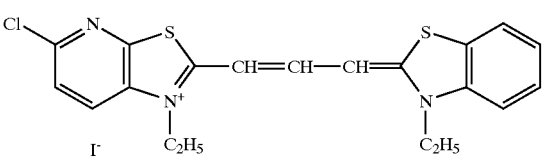
No. 11
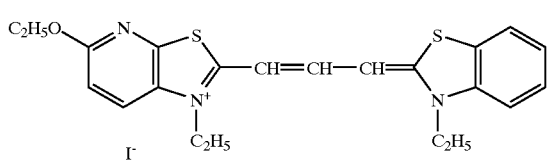
No. 12
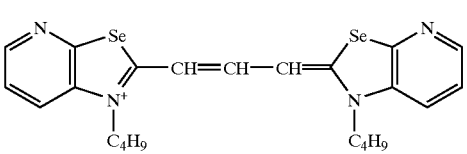
No. 13
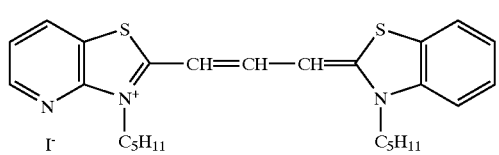
No. 14
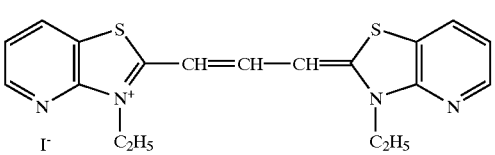
No. 15
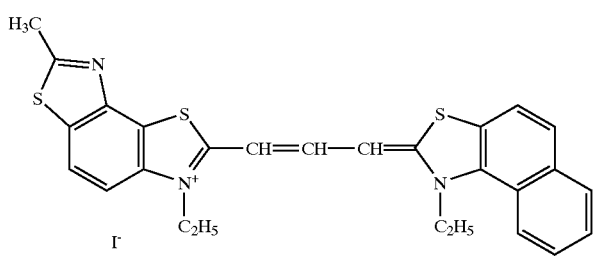

-continued
No. 16
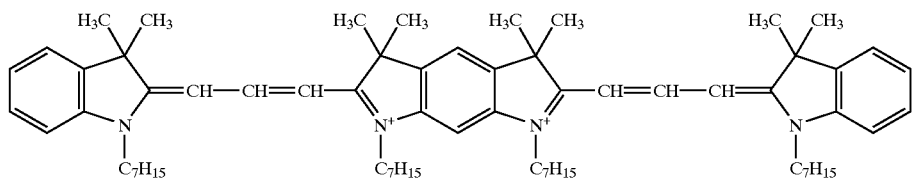
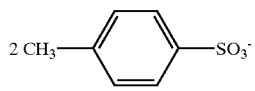
No. 17
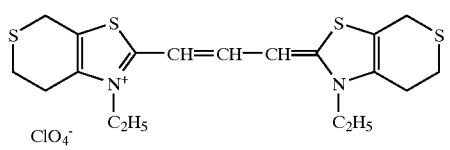
No. 18
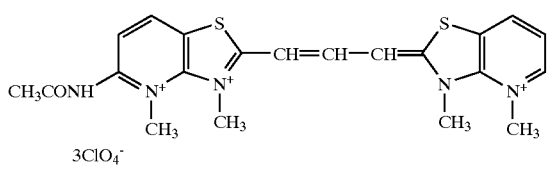
No. 19
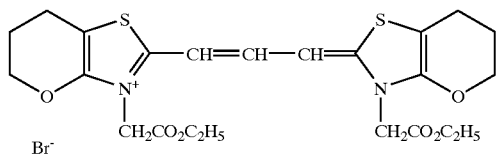
No. 20
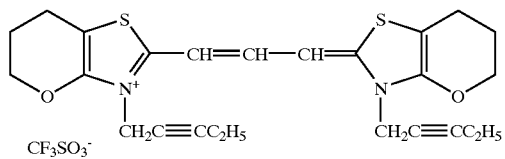
No. 21
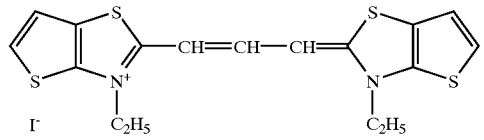
No. 22
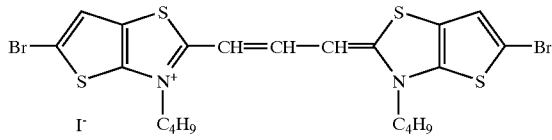
No. 23
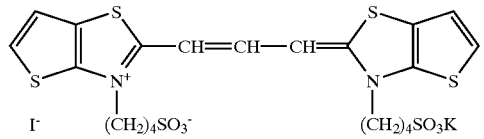
No. 24
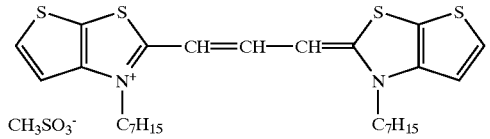
No. 25
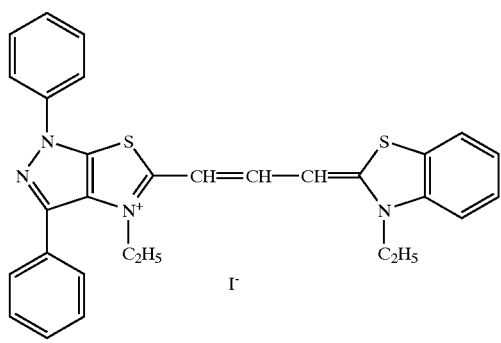
No. 26
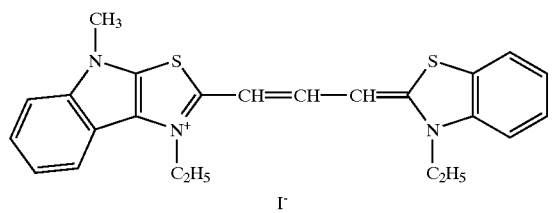
No. 27
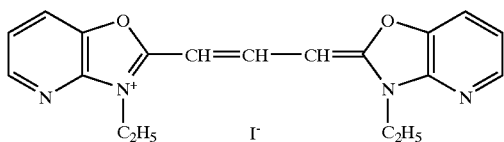
No. 28
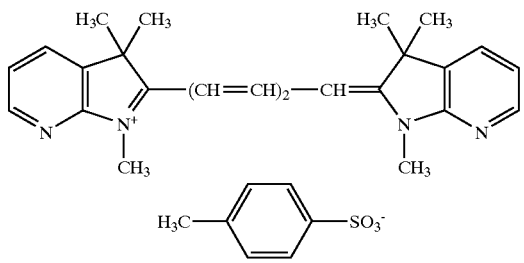

-continued

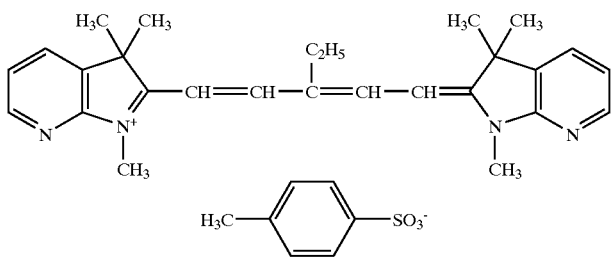

No. 29

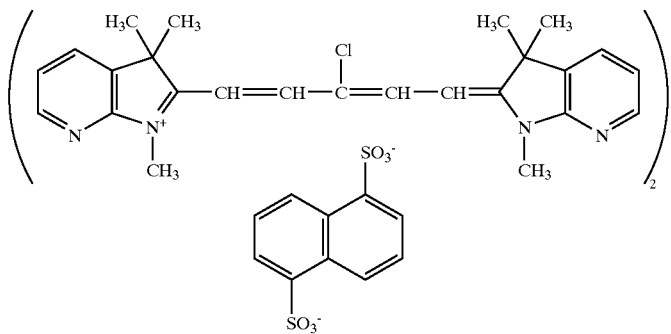

No. 30

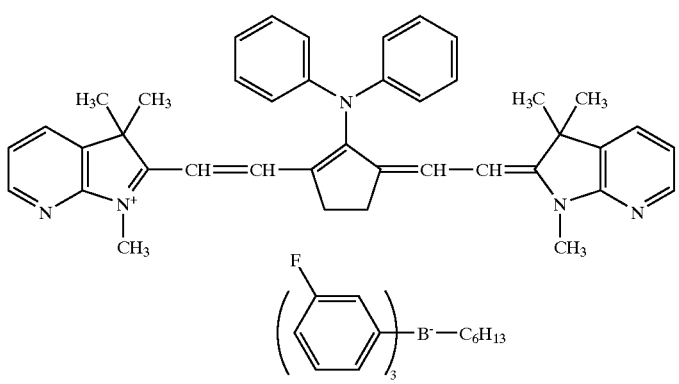

No. 31

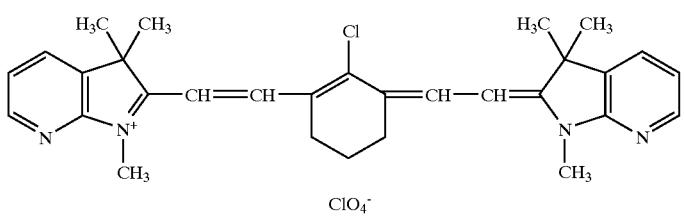

No. 32

The compound represented by the general formula (I) may be used solely or in combination of two or more of them.

The content of the compound represented by the general formula (I) in the photopolymerizable composition of the invention is preferably from 0.01 to 5 parts by weight, and more preferably from 0.05 to 2 parts by weight, per 1 part by weight of the radical generator described later, in order to improve the sensitivity and the decolorization property.

When the content is less than 0.01 part by weight, there are some cases where the photopolymerization sensitivity is lowered, and when it exceeds 5 parts by weight, there are some cases where the decolorization of the dye requires a long period of time.

Because the compound represented by the general formula (I) is contained, the photopolymerization sensitivity of the photopolymerizable composition can be improved, and high sensitivity can be realized not only for ultraviolet light but also for light in the range from visible light to infrared light. Furthermore, the compound represented by the general formula (I) is excellent in decolorization property owing to high decomposition property caused by the action of the radical generated from the radical generator and said compound on each other. Thus decolorization can be quickly attained without the need for a long period of time. Therefore, even in the case where the photopolymerizable composition is applied to a recording material for a completely dry system using no developer solution, coloration on the non-image part (background part) of the resulting image can be lowered and thus a sharp image with high contrast is formed.

Radical Generator

The photopolymerizable composition of the invention contains a radical generator capable of forming a radical by the effect of the spectral sensitizing dye and said photopolymerizable composition on each other. Because the radical generator is used in the presence of the spectral sensitizing dye, the radical generator is highly sensitive to irradiated light which is within the spectral absorption wavelength region and thus the radical is formed with high efficiency. Therefore, the sensitivity thereof is increased, and the formation of radicals can be controlled by using a suitably selected light source which emit light in a range of from visible light to infrared light.

The radical generator can be used by selecting one kind or two or more kinds from radical generators that can initiate polymerization of the polymerizable compound contained in the photopolymerizable composition.

Examples of the radical generator include an aromatic ketone, such as benzophenone, camphorquinone, 4,4-bis (dimethylamino)benzophenone, 4-methoxy-4'-dimethylaminobenzophenone, 4,4'-dimethoxybenzophenone, 4-dimethylaminobenzophenone, 4-dimethylaminoacetophenone, benzylanthraquinone, 2-tert-butylanthraquinone, 2-methylanthraquinone, xanthone, thioxanthone, 2-chlorothioxanthone, 2,4-diethylthioxanthone, fluorenone, acridone, a bisacylphosphine oxide, e.g., bis(2,4,6-trimethylbenzoyl) phenylphosphine oxide, an acylphosphine oxide, e.g., Lucirin TPO, an α-hydroxy- or α-aminoacetophenone, an α-hydroxychloroalkylphenyl ketone and a dialkoxyacetophenone;

- a benzoin and a benzoin ether, such as benzoin methyl ether, benzoin ethyl ether, benzoin isopropyl ether and benzoin phenyl ether; a 2,4,6-triarylimidazole dimer, such as a 2-(o-chlorophenyl)-4,5-diphenylimidazole dimer, a 2-(o-chlorophenyl)-4,5-di(m-methoxyphenyl) imidazole dimer, a 2-(o-fluorophenyl)-4,5-diphenylimidazole dimer, a 2-(o-methoxyphenyl)-4,5-diphenylimidazole dimer and a 2-(p-methoxyphenyl)-4,5-diphenylimidazole dimer; compounds described in U.S. Pat. No. 3,784,557, No. 4,252,887, No. 4,311,783, No. 4,459,349, No. 4,410,621 and No. 4,622,286;
- a polyhalogen compound, such as carbon tetrabromide, phenyltribromomethylsulfone and phenyl trichloromethyl ketone; compounds described in JP-A-59-133428, JP-B-57-1819, JP-B-57-6096 and U.S. Pat. No. 3,615,455;
- an S-triazine having a trihalogen-substituted methyl group described in JP-A-58-29803, such as 2,4,6-tris (trichloromethyl)-S-triazine, 2-methoxy-4,6-bis (trichloromethyl)-S-triazine, 2-amino-4,6-bis (trichloromethyl)-S-triazine and 2-(p-methoxystyryl)-4,6-bis(trichloromethyl)-S-triazine;
- an organic peroxide described in JP-A-59-189340, such as methyl ethyl ketone peroxide, cyclohexanone peroxide, 3,3,5-trimethylcyclohexanone peroxide, benzoyl peroxide, di-tert-butyl diperoxyisophthalate, 2,5-dimethyl-2,5-di(benzoylperoxy)hexane, tert-butyl peroxybenzoate, a,a'-bis(tert-butylperoxyisopropyl) benzene, dicumyl peroxide and 3,3',4,4'-tetra(tert-butylperoxycarbonyl)benzophenone;
- an adinium salt described in U.S. Pat. No. 4,743,530; an organic boron compound; a phenylglyoxalate, such as methyl phenylglyoxalate; a titanocene, such as bis(η$^5$-2,4-cyclopentadien-1-yl)-bis(2,6-difluoro-3-(1H-pyrrol-1-yl)-phenyl)titanium; an iron allene complex, such as η$^5$-cyclopentadienyl-η$^6$-cumenyl-iron(1+)-hexafluorophosphate(1−); a diaryliodonium salt, such as diphenyliodonium salt; and a triarylsulfonium salt, such as triphenylsulfonium salt.

More specific example compounds of the foregoing radical generators and examples of other kinds of radical generators are described, for example, in the paragraphs from (0067) to (0123) of JP-A-10-45816.

The radical generator may be a combination of two or more kinds of compounds. Examples thereof include a combination of a 2,4,5-triarylimidazole dimer and mercaptobenzoxazole, a combination of 4,4'-bis (dimethylamino)benzophenone, benzopheneone and benzoin methyl ether described in U.S. Pat. No. 3,427,161, a combination of benzoyl-N-methylnaphthothiazoline and 2,4-bis(trichloromethyl)-6-(4'-methoxyphenyl)triazole described in U.S. Pat. No. 4,239,850, a combination of a dialkylaminobenzoate and dimethylthioxanthone described in JP-A-57-23602, and a combination of 4,4'-bis (dimethylamino)benzophenone, benzophenone and a polyhalogenated methyl compound described in JP-A-59-78339.

In the case of the radical generator formed by combining two or more kinds thereof, a combination of 4,4'-bis (dimethylamino)benzophenone and benzophenone, a combination of 2,4-diethylthioxanthone and ethyl 4-dimethylaminobenzoate, and a combination of 4,4'-bis (diethylamino)benzophenone and 2,4,5-triarylimidazole dimer are preferably used.

Among the foregoing radical generators, an organic boron compound, a diaryliodonium salt, an iron allene complex, an S-triazine derivative having a trihalogen-substituted methyl group, an organic peroxide, a titanocene, 2,4,5-triarylimidazole dimer and an adinium salt compound are preferred, and an organic boron compound is particularly preferred. This is because these compounds and the dye act on each other in the exposed region to form a radical with high efficiency, whereby high sensitivity is realized. The organic boron compound is preferred because when a spectral sensitizing dye is used as a spectral sensitizing compound, the coexistent spectral sensitizing dye can be suitably decolorized upon fixing an image by irradiation of light. The organic boron compound may be used in combination with the foregoing radical generators.

Examples of the organic boron compound include a compound represented by the general formula (A) described later and a spectral sensitizing dye type organic boron compound having a cationic dye as a cation part in the structure thereof described in "Kinousei Shikiso no Kagaku (Chemistry of Functional Dyes)", pp. 393 to 416 (published by CMC Press, 1981) and "Shikizai (Color Materials)", vol. 60(4), pp. 212 to 224 (1987). Examples of the spectral sensitizing dye type organic boron compound include compounds described in JP-A-62-143044, JP-A-1-138204, JP-W-6-505287 and JP-A-4-261406.

As the dye constituting the cation part of the spectral sensitizing dye types organic boron compound, a cationic dye having a maximum absorption wavelength within a wavelength range of 300 nm or more, and preferably within a wavelength range of from 400 to 1,100 nm, can be used. In particularly, a cationic methine dye, a polymethine dye, a triarylmethane dye, an indoline dye, an azine dye, a xanthene dye, a cyanine dye, a hemicyanine dye, a rhodamine dye, an azomethine dye, an oxazine dye and an acridine dye are preferred, and a cationic cyanine dye, a hemicyanine dye, a rhodamine dye and an azomethine dye are more preferred.

Among the foregoing organic boron compounds, a compound represented by the following general formula (A) is particularly preferred:

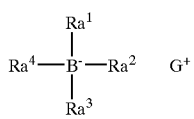

(A)

wherein $R_a^1$, $R_a^2$, $R_a^3$ and $R_a^4$ each independently represents an aliphatic group, an aromatic group, a heterocyclic group or $Si(R_a^5)(R_a^6)$-$R_a^7$.

In the case where $R_a^1$ to $R_a^4$ each represents an aliphatic group, examples of the aliphatic group include an alkyl group, a substituted alkyl group, an alkenyl group, a substituted alkenyl group, an alkynyl group, a substituted alkynyl group, an aralkyl group and a substituted aralkyl group. Among these, an alkyl group, a substituted alkyl group, an alkenyl group, a substituted alkenyl group, an aralkyl group and a substituted aralkyl group are preferred, and an alkyl group and a substituted alkyl group are particularly preferred.

The aliphatic group may be either an alicyclic group or a linear aliphatic group. The linear aliphatic group may have a branch.

Examples of the alkyl group include a linear, branched or cyclic alkyl group, and the number of carbon atoms of the alkyl group is preferably from 1 to 30, and more preferably from 1 to 20. The alkyl group may be either an alkyl group having a substituent or an unsubstituted alkyl group, and the range for the number of carbon atoms of the alkyl part of the substituted alkyl group is the same as the alkyl group.

Examples of the alkyl group include a methyl group, an ethyl group, a propyl group, a butyl group, a pentyl group, a hexyl group, a cyclopentyl group, a neopentyl group, an isopropyl group, an isobutyl group, a cyclohexyl group, an octyl group, a 2-ethylhexyl group, a decyl group, a dodecyl group and an octadecyl group.

Examples of the substituent for the substituted alkyl group include a carboxyl group, a sulfo group, a cyano group, a halogen atom (such as a fluorine atom, a chlorine atom and a bromine atom), a hydroxyl group, an alkoxycarbonyl group having 30 or less carbon atoms (such as a methoxycarbonyl group, an ethoxycarbonyl group and a benzylcarbonyl group), an alkylsulfonylaminocarbonyl group having 30 or less carbon atoms, an arylsulfonylaminocarbonyl group, an alkylsulfonyl group, an arylsulfonyl group, an acylaminosulfonyl group having 30 or less carbon atoms, an alkoxy group having 30 or less carbon atoms (such as a methoxy group, an ethoxy group, a benzyloxy group and a phenethyloxy group), an alkylthio group having 30 or less carbon atoms (such as a methylthio group, an ethylthio group and a methylthioethylthioethyl group), an aryloxy group having 30 or less carbon atoms (such as a phenoxy group, a p-tolyloxy group, a 1-naphthoxy group and a 2-naphthoxy group), a nitro group, an alkyl group having 30 or less carbon atoms, an alkoxycarbonyloxy group, an aryloxycarbonyloxy group, an acyloxy group having 30 or less carbon atoms (such as an acetyloxy group and a propyonyloxy group), an acyl group having 30 or less carbon atoms (such as an acetyl group, a propyonyl group and a benzoyl group), a carbamoyl group (such as a carbamoyl group, an N,N-dimethylcarbamoyl group, a morpholinocarbonyl group and a piperidinocarbonyl group), a sulfamoyl group (such as a sulfamoyl group, N,N-dimethylsulfamoyl group, a morpholinosulfonyl group and a piperidinosulfonyl group), an aryl group having 30 or less carbon atoms (such as a phenyl group, a 4-chlorophenyl group, 4-methylphenyl group and an α-naphthyl group), a substituted amino group (such as an amino group, an alkylamino group, a dialkylamino group, an arylamino group, a diarylamino group and an acylamino group), a substituted ureido group, a substituted phosphono group and a heterocyclic group. A carboxyl group, a sulfo group, a hydroxyl group and a phosphono group herein may be in the form of a salt. Examples of a cation forming the salt include $G^+$ described later.

Examples of the alkenyl group include a linear, branched or cyclic alkenyl group, and the carbon number of the alkenyl group is preferably from 2 to 30, and more preferably from 2 to 20. The alkenyl group may be either a substituted alkenyl group having a substituent or an unsubstituted alkenyl group, and the range of the carbon number of the alkenyl part of the substituted alkenyl group is the same as the case of the alkenyl group.

Examples of the substituent for the substituted alkenyl group include those exemplified for the substituted alkyl group.

Examples of the alkynyl group include a linear, branched or cyclic alkynyl group, and the carbon number of the alkynyl group is preferably from 2 to 30, and more preferably from 2 to 20. The alkynyl group may be either an alkynyl group having a substituent or an unsubstituted alkynyl group, and the range of the carbon number of the alkynyl part of the substituted alkynyl group is the same as the case of the alkynyl group.

Examples of the substituent for the substituted alkynyl group include those exemplified for the substituted alkyl group.

Examples of the aralkyl group include a linear, branched or cyclic aralkyl group, and the carbon number of the aralkyl group is preferably from 7 to 35, and more preferably from 7 to 25. The aralkyl group may be either an aralkyl group having a substituent or an unsubstituted aralkyl group, and the range of the carbon number of the aralkyl part of the substituted aralkyl group is the same as the case of the aralkyl group.

Examples of the substituent for the substituted aralkyl group include those exemplified for the substituted alkyl group.

In the case where $R_a^1$ to $R_a^4$ each represents an aromatic group, examples of the aromatic group include an aryl group and a substituted aryl group. The carbon number of the aryl group is preferably from 6 to 30, and more preferably from 6 to 20. The range of the carbon number of the aryl part of the substituted aryl group is the same as the case of the aryl group. Examples of the aryl group include a phenyl group, an α-naphthyl group and a β-naphthyl group.

Examples of the substituent for the substituted aryl group include those exemplified for the substituted alkyl group.

In the case where $R_a^1$ to $R_a^4$ each represents a heterocyclic group, examples of the heterocyclic group include a heterocyclic group having a substituent and an unsubstituted heterocyclic group. Examples of the substituent for the heterocyclic group having a substituent include those exemplified in the case where $R_a^1$ to $R_a^4$ each represents a substituted aryl group.

In particular, preferred examples of the heterocyclic group represented by $R_a^1$ to $R_a^4$ include a heterocyclic group containing a nitrogen atom, a sulfur atom or an oxygen atom, such as a furan ring, a pyrrole ring, an imidazole ring, an oxazole ring, a thiazole ring and a pyridine ring.

In the case where $R_a^1$ to $R_a^4$ each represents $Si(R_a^5)(R_a^6)$—$R_a^7$, $R_a^5$, $R_a^6$ and $R_a^7$ each independently represents an aliphatic group or an aromatic group. The aliphatic group and the aromatic group are defined in the same way as the aliphatic group and the aromatic group represented by $R_a^1$ to $R_a^4$ and preferred examples thereof are also the same.

In the general formula (A), two or more of $R_a^1$, $R_a^2$, $R_a^3$ and $R_a^4$ may be directly combined or combined through a substituent to form a ring. In the case where a ring is formed, preferred examples of the ring include those represented by the following (C1) to (C3), and among these, a ring represented by (C2) is particularly preferred.

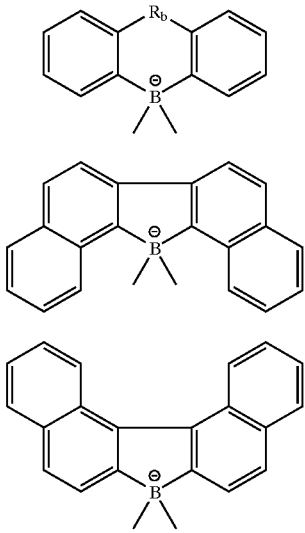

(C1)

(C2)

(C3)

In a ring represented by (C1), Rb represents divalent groups shown below.

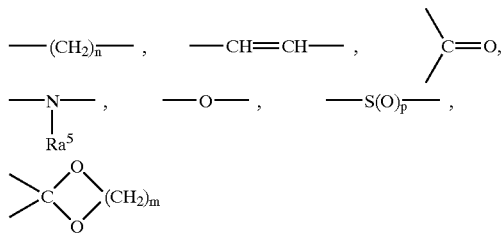

Wherein n represents 0, 1 or 2; p represents 0, 1 or 2; $R_a^5$ represents a hydrogen atom or a monovalent substituent; and m represents 2 or 3.

In the organic boron compound represented by the general formula (A), those where at least one of $R_a^1$ to $R_a^4$ represents an alkyl group is preferred, and from the standpoint of high sensitivity and improvement in storage stability, a triarylalkyl type organic boron compound where one of them represents an alkyl group and the other three each represents an aryl group is more preferred.

In particular, a triarylalkyl type organic boron compound having an electron attractive group substituted on the aryl group is preferred, and one in which the total of the Hammet (σ) values of the substituents (electron attractive groups) on the three aryl groups is from +0.36 to +2.58 is more preferred.

As the electron attractive group, a halogen atom and a trifluoromethyl group are preferred, and a fluorine atom and a chlorine atom are more preferred.

Examples of the aryl group substituted with an electron attractive group include a 3-fluorophenyl group, a 4-fluorophenyl group, a 2-fluorophenyl group, a 3-chlorophenyl group, a 4-chlorophenyl group, a 3-trifluoromethylphenyl group, a 4-trifluoromethylphenyl group, a 3,5-difluorophenyl group, a 4-bromophenyl group, a 3,4-difluorophenyl group, a 5-fluoro-2-methylphenyl group, a 5-fluoro-4-methylphenyl group, a 5-chloro-2-methylphenyl group and a 5-chloro-4-methylphenyl group.

Examples of the anion part of the general formula (A) include tetramethyl borate, tetraethyl borate, tetrabutyl borate, triisobutyl borate, di-n-butyl-di-t-butyl borate, tri-m-chlorophenyl-n-hexyl borate, triphenylmethyl borate, triphenylethyl borate, triphenylpropyl borate, triphenyl-n-butyl borate, trimethylbutyl borate, tritolylisopropyl borate, triphenylbenzyl borate, tetra-m-fluorobenzyl borate, triphenylphenethyl borate, triphenyl-p-chlorobenzyl borate, triphenylethenylbutyl borate, di (α-naphthyl)dipropyl borate, triphenylsilyltriphenyl borate, tritoluylsilyltriphenyl borate, tri-n-butyl(dimethylphenylsilyl)borate, diphenyldihexyl borate, tri-m-fluorophenylhexyl borate, tri(5-chloro-4-methylphenyl)hexyl borate, tri-m-fluorophenylcyclohexyl borate and tri(5-fluoro-2-methylphenyl)hexyl borate.

In the general formula (A), $G^+$ represents a group capable of forming a cation. In particular, an organic cationic compound, a transition metal-coordinated complex cation (such as compounds described in Japanese Patent No. 2,791,143) and a metallic cation (such as $Na^+$, $K^+$, $Li^+$, $Ag^+$, $Fe^{2+}$, $Fe^{3+}$, $Cu^+$, $Cu^{2+}$, $Zn^{2+}$, $Al^{3+}$ and $1/2Ca^{2+}$) are preferred.

Examples of the organic cationic compound include a quaternary ammonium cation, a quaternary pyridinium cation, a quaternary quinolinium cation, a phosphonium cation, an iodonium cation, a sulfonium cation and a dye cation.

Examples of the quaternary ammonium cation include a tetraalkylammonium cation (such as a tetramethylammonium cation and a tetrabutylammonium cation) and a tetraarylammonium cation (such as a tetraphenylammonium cation). Examples of the quaternary pyridinium cation include an N-alkylpyridinium cation (such as an N-methylpyridinium cation), an N-arylpyridinium cation (such as an N-phenylpyridinium cation), an N-alkoxypyridinium cation (such as a 4-phenyl-N-methoxypyridinium cation) and an N-benzoylpyridinium cation. Examples of the quaternary quinolinium cation include an N-alkylquinolinium cation (such as an N-methylquinolinium cation) and an N-arylquinolinium cation (such as an N-phenylquinolinium cation). Examples of the phosphonium cation include a tetraarylphosphonium cation (such as a tetraphenylphosphonium cation). Examples of the iodonium cation include a diaryliodonium cation (such as a diphenyliodonium cation). Examples of the sulfonium cation include a triarylsulfonium cation (such as a triphenylsulfonium cation).

Further specific examples of $G^+$ include compounds described in the paragraphs (0020) to (0038) of JP-A-9-188686.

In the cationic compounds exemplified in the foregoing (example compounds), the alkyl group is preferably an alkyl group having from 1 to 30 carbon atoms, and for example, an unsubstituted alkyl group, such as a methyl group, an ethyl group, a propyl group, an isopropyl group, a butyl group and a hexyl group, and the substituted alkyl groups represented by $R_a^1$ to $R_a^4$ are preferred. Among these, an alkyl group having from 1 to 12 carbon atoms is particularly preferred.

In the cationic compounds exemplified in the foregoing, the aryl group is preferably a phenyl group, a halogen atom-substituted phenyl group (such as a chlorine atom-substituted phenyl group), an alkyl group-substituted phenyl group (such as a methyl group-substituted phenyl group) and an alkoxy group-substituted phenyl group (such as a methoxy group-substituted phenyl group) are preferred.

Specific examples of the organic boron compound represented by the general formula (A) include compounds described in U.S. Pat. No. 3,567,453, No. 4,343,891, JP-A-62-143044, JP-A-62-150242, JP-A-9-188684, JP-A-9-188685, JP-A-9-188686, JP-A-9-188710, JP-B-8-9643 and JP-A-11-269210, and the following compounds. The organic boron compound may be used in combination with the radical generator described in the foregoing. The organic boron compound that can be used in the invention is not limited to those described herein.

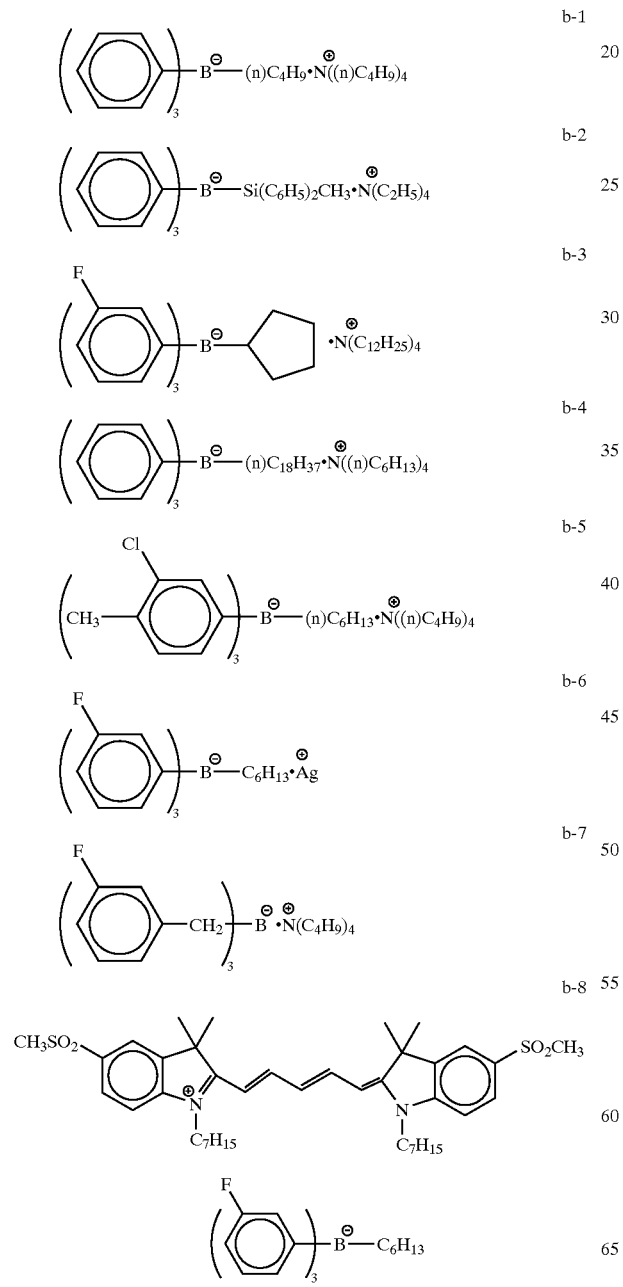
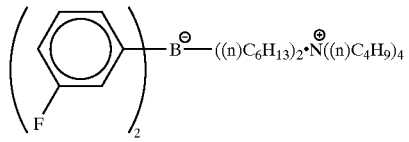
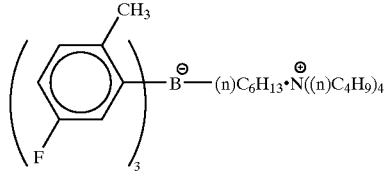
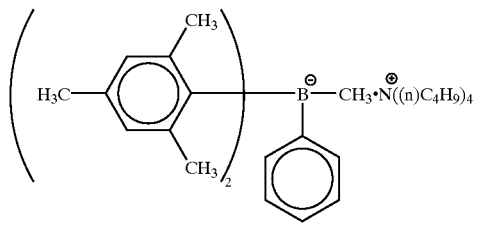
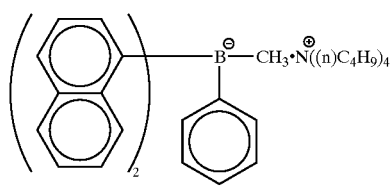
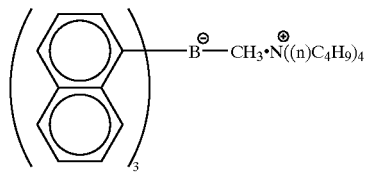
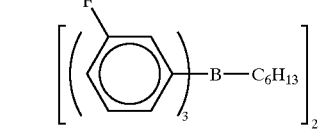
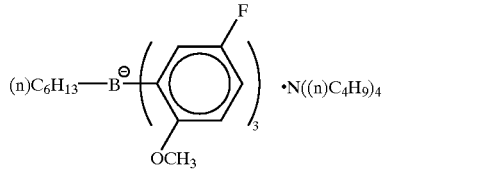

-continued b-17
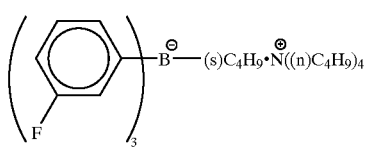

b-18
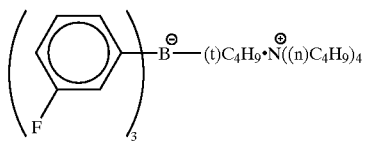

b-19
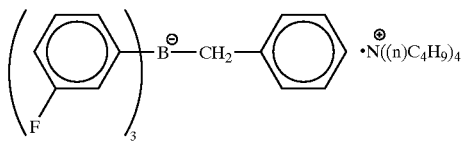

b-20
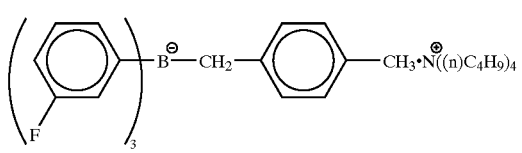

b-21
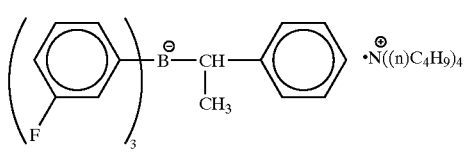

b-22
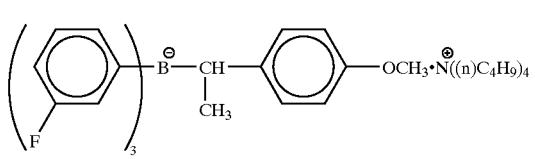

b-23
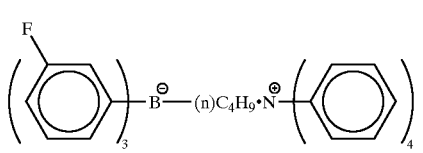

b-24
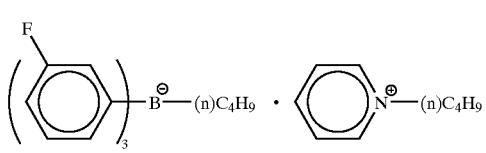

b-25
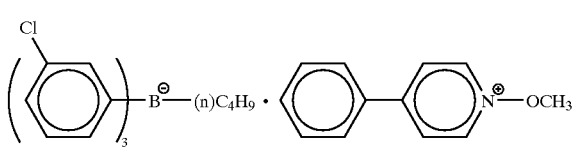

b-26
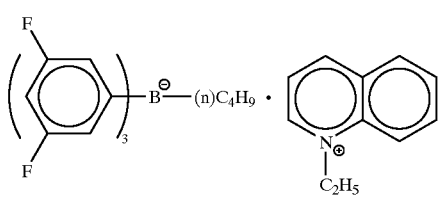

-continued b-27
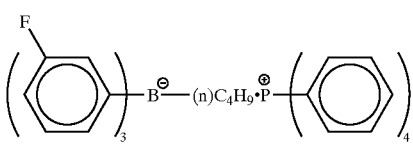

b-28
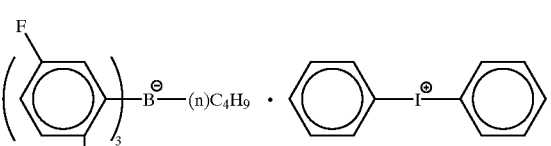

b-29
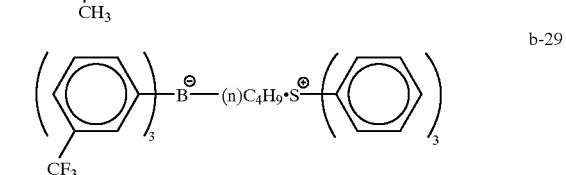

b-30
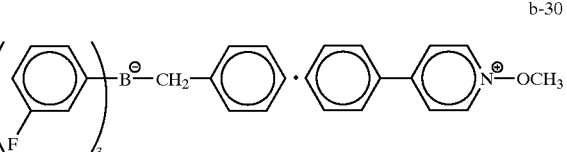

b-31
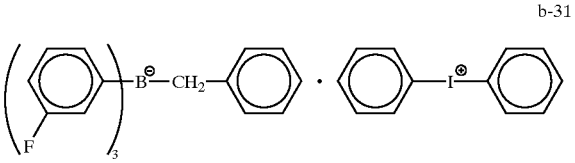

b-32
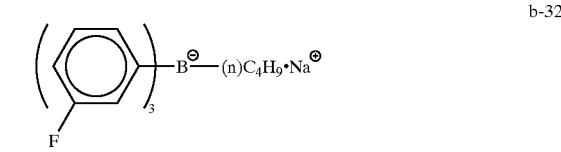

b-33
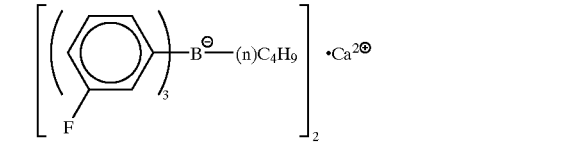

In the photopolymerizable composition of the invention, the content of the radical generator is preferably from 0.01 to 20% by weight, and more preferably from 0.1 to 10% by weight, based on the content of the polymerizable compound having an ethylenic unsaturated bond in order to improve the sensitivity and the decolorization property. However, the preferred range is not limited to the values herein because it varies depending on the types of the polymerizable compound having an ethylenic unsaturated bond.

Other Components

In the photopolymerizable composition of the invention, suitably selected known additives may be contained in accordance with purpose as other components in such a range that does not impair the effect of the invention.

Examples of the other components include a photopolymerization initiator, an oxygen remover, a thermal polymerization inhibitor, ultraviolet light absorbent, a fluorescent brightening agent, a chain transfer agent, an antioxidant and their precursors. These components are preferably added in an amount of from 0.01 to 20%, more preferably from 0.2 to 15% by weight, and particularly preferably from 0.5 to 10% by weight, based on the total weight of the photopolymerizable composition.

Specific examples of the chain transfer agent and the antioxidant include those shown in the paragraphs (0135) to (0141) of JP-A-10-45816, the paragraphs (0087) to (0096) of JP-A-9-188686, the paragraphs (0079) to (0118) of JP-A-10-182621 and the paragraphs (0080) to (0089) of JP-A-9-95487, and further examples thereof include compounds described in JP-A-1-13140, JP-A-1-13141, JP-A-1-13143, JP-A-1-13144, JP-A-1-17048, JP-A-1-229003, JP-A-1-298348, JP-A-10-138638, JP-A-11-269210 and JP-A-2-187762.

The photopolymerizable composition of the invention may contain a binder. A binder is preferably contained particularly in the case where the photopolymerizable composition is in the form of a liquid or a viscous substance.

The content of the binder is preferably from 5 to 95% by weight, more preferably from 10 to 90% by weight, and most preferably from 15 to 85% by weight, based on the total solid content.

The binder is appropriately selected depending on the applied filed of the photopolymerizable composition and the characteristics thereof that are required in the applied field, such as the developing capability in an aqueous system or an organic solvent system, adhesion to a base material, and sensitivity to oxygen.

Preferred examples of the binder include a polymer having a molecular weight of about from 5,000 to 2,000,000, and more preferably from 10,000 to 1,000,000. Examples thereof include a homopolymer or a copolymer of an acrylate and a methacrylate (such as a copolymer of methyl methacrylate, ethyl acrylate and methacrylic acid, poly(alkyl methacrylate) and poly(alkyl acrylate), a cellulose ester or a cellulose ether (such as cellulose acetate, cellulose acetobutylate, methyl cellulose and ethyl cellulose), polyvinyl butyral, polyvinyl formal, cyclized rubber, polyether (such as polyethylene oxide, polypropylene oxide and polytetrahydrofuran), polystyrene, polycarbonate, polyurethane, chlorinated polyolefin, polyvinyl chloride, a vinyl chloride-vinylidene copolymer, a copolymer of vinylidene chloride and acrylonitrile, polymethyl methacrylate, polyvinyl acetate, copoly(ethylene-vinyl acetate), polycaprolactam, poly(hexamethylene adipamide), polyester (such as poly(ethylene glycol terephthalate) and poly(hexamethylene glycol succinate)), polyamide and polyurea.

Further examples thereof include a water soluble polymer, such as gelatin, (modified) polyvinyl alcohol, polyvinyl pyrrolidone, a hydrolysate of a styrene-maleic acid copolymer, polyethylene sodium sulfonate and sodium alginate. Moreover, a latex, such as a styrene-butadiene rubber latex, an acrylonitrile-butadiene rubber latex and a methyl acrylate-butadiene rubber latex, may also be used.

An unsaturated compound may be used as a mixture with another non-photopolymerizable film forming component. A photopolymerizable film forming component is a physically dried polymer or a polymer solution in an organic solvent, and examples thereof include nitrocellulose and cellulose acetobutyrate. They may be a chemical and/or thermal curing (thermosetting) resin, such as polyisocyanate, polyepoxide, a melamine resin and a polyimide precursor. The use of the thermosetting resin is important for the application to such a system that has been known as the hybrid system, in which photopolymerization is carried out as the first step, and then crosslinking is carried out through a heat post-treatment as the second step.

A binder having a polymerizable group can also be used.

Examples of other additives include those described in JP-A-11-269210.

A light source that can be used for imagewise exposure may be appropriately selected from known light sources having light whose wavelength is in the visible to infrared region. In particular, a light source having a maximum absorption wavelength of from 300 to 1,000 nm is preferred, and a (semiconductor) laser and an LED of blue color, green color or red color are preferred from the standpoint of simplicity and compactness of the equipment and reduction of cost. In order to obtain higher sensitivity, it is preferred that such a light source is appropriately selected that has a wavelength matching with the absorption wavelength of the light absorbing material, such as the spectral sensitizing dye.

It is preferred that a light source that can be used for decolorization of the photopolymerizable composition and the recording material described later is appropriately selected from light sources having a wavelength matching with the absorption wavelength of the photopolymerization composition. Specific examples thereof include wide variety of light sources, such as a mercury lamp, an ultrahigh pressure mercury lamp, an electrodeless discharge mercury lamp, a xenon lamp, a tungsten lamp, a metal halide lamp, a (semiconductor) laser light source, an LED and a fluorescent lamp.

As described in the foregoing, because the compound represented by the general formula (I) is used as a spectral sensitizing dye, an image can be formed by using not only ultraviolet light but also visible light to infrared light, and an image with no residual color due to dye components can be obtained owing to the excellent decolorization property of the compound itself.

Recording Material

The recording material of the invention comprises a support having thereon a recording layer, and the recording layer at least contains a color forming component A, a color forming component B having a site that forms a color upon reaction with the color forming component A, and the photopolymerizable composition of the invention. The recording material may further comprise, depending on necessity, other layers, such as an undercoating layer, an intermediate layer, a light absorbing layer, a protective layer and a back coating layer.

The basic constitution of the recording material of the invention is not particularly limited and the recording material may be appropriately configured in accordance with its purpose.

An embodiment will be described below which has the basic constitution where the recording material of the invention is applied to a positive light and heat sensitive recording material having the color forming component A contained in heat-responsive microcapsules.

According to the positive light and heat sensitive recording material of this embodiment, upon imagewise irradiation with light, radicals are formed from the radical generator contained in the photopolymerizable composition on the part irradiated with light, thus initiating the polymerization reaction of the polymerizable compound, whereby the photopolymerizable composition is cured and fixed thereon to form a latent image. The microcapsules are impermeable to substances at ordinary temperatures, and the color forming component A contained in the microcapsules and the color forming component B do not come in contact with each other thus maintaining the state in which no color is formed.

Thereafter, upon applying heat to the whole surface of the light and heat sensitive recording material, the microcapsule becomes permeable to substances, and the color forming component B on the part which was not irradiated with light penetrates to the interior of the microcapsules (and/or the color forming component A is released to the outside of the microcapsules) to effect a reaction between the color forming component A and the color forming component B, whereby coloration occurs only on the part which was not irradiated with light. On the irradiated part, on the other hand, the photopolymerizable composition is cured through the polymerization reaction and is in the fixed state, and therefore, the color forming component A and the color forming component B are immobilized and fail to make contact with each other, whereby no coloration occurs in the irradiated part. Thereafter, upon exposing the whole surface of the light and heat sensitive recording material, the resin that has not been polymerized is then polymerized (fixed), whereby the dye component contained in the photopolymerizable composition is decolorized.

The recording material of the invention may be the embodiments described below (a first embodiment and a second embodiment) of the recording material, and a process for forming an image therefor can be appropriately selected depending on the embodiments.

According to the first embodiment of the recording material, at least one of the polymerizable compound contained in the photopolymerization composition is the color forming component B itself, and the recording layer contains at least a color forming component A and a photopolymerization composition of the invention containing the color forming component B that causes the color forming component A to form color. When the embodiment is applied to the positive light and heat sensitive recording material having the foregoing basic constitution, the color forming component B has a site that causes the color forming component A to form color and also has an ethylenic unsaturated bond as has been described, and upon imagewise irradiation with light, the color forming component B starts the polymerization reaction thus causing curing, and the color forming component B is fixed thereon to form a latent image. Therefore, the color forming component B is immobilized on the part of the recording material irradiated with light and cannot contact the color forming component A, thus failing to form color in the irradiated part.

According to the second embodiment of the recording material, the recording layer contains at least a color forming component A, a color forming component B that causes the color forming component A to form color through reaction therewith, and the photopolymerizable composition of the invention, and the polymerizable compound having an ethylenic unsaturated bond (polymerizable compound) contained in the polymerizable composition is a coloring suppressing compound having, in the same molecule, a site that suppresses the reaction between the color forming component A and the color forming component B (reaction suppressing site).

For example, image formation where the second embodiment is applied to a negative light and heat sensitive recording material having a color forming component A contained in heat-responsive microcapsules will be described below.

In the negative light and heat sensitive recording material of the embodiment, the microcapsules are impermeable to substances under ordinary temperature, and the color forming components A and B are not in contact with each other thus maintaining the state in which color is not formed. Upon imagewise irradiation of the light and heat sensitive recording material with light, the polymerizable compound on the light irradiated part initiates the polymerization reaction and curing is thereby carried out, and the polymerizable compound is fixed thereon to form a latent image. Thereafter, upon applying heat on the whole surface of the light and heat sensitive recording material, the microcapsules becomes permeable to substances, and the color forming component B penetrates to the interior of the microcapsules (and/or the color forming component A is released to the outside of the microcapsules). Simultaneously, on the non-irradiated part, the polymerizable compound which is a coloring suppressing compound also penetrates to the interior of the microcapsules to suppress the color forming reaction between the color forming components A and B. Therefore, the non-irradiated part is maintained in the non-colored state. On the other hand, the polymerizable compound (color-formation suppressing compound) on the irradiated part is fixed through the polymerization reaction, and thus it does not affect the reaction between the color forming components A and B, whereby the coloring reaction proceeds to form color only on the light irradiated part. Thereafter, upon exposing the whole surface of the light and heat sensitive recording material, the dye contained in the photopolymerizable composition can be decolorized.

The light source used for image formation of the recording material of the invention can be the same light sources that can be used for exposing the photopolymerizable composition of the invention described in the foregoing.

The components which constitute the recording material of the invention will be described below.

Photopolymerizable Composition

The photopolymerizable composition contains (1) a polymerizable compound having an ethylenic unsaturated bond (polymerizable compound), (2) a decolorizable organic dye (spectral sensitizing dye) and (3) a radical generator capable of forming a radical by the dye and said radical generator acting on each other, and may further contain, according to necessity, (4) other components. In the recording material of the invention, the photopolymerizable composition of the invention described in the foregoing.

When the photopolymerizable composition is irradiated with light, the spectral sensitizing dye absorbs the light and the radical generator and the dye act on each other, and the radical generator forms radicals. The polymerizable compound undergoes radical polymerization by the effect of the radicals and is thereby cured, and an image is formed.

The details of the polymerizable compound have been described in the foregoing, and plural kinds of the polymerizable compounds may be contained in the photopolymerizable composition. As in the first embodiment of the recording material, at least one of the polymerizable compounds may be the color forming component B having a site that causes the color forming component A to form color, and a color forming component having an ethylenic unsaturated bond (polymerizable group) in the same molecule is used as described later.

On the other hand, as in the second embodiment of the recording material, the polymerizable compound may also function to suppress color formation, and a color forming component having a site that suppresses the reaction between the color forming component A and the color forming component B that causes the color forming component A to form color in the same molecule is used.

These polymerizable compounds will be described later along with the color forming components A and B contained in the recording layer.

The content of the photopolymerizable composition in the recording layer is preferably from 0.1 to 50 $g/m^2$, and more preferably from 1 to 30 $g/m^2$.

Color Forming Component

In the recording material of the invention, the recording layer contains the color forming component A and the color forming component B as a color source along with the photopolymerizable composition. In the case of the first embodiment of the recording material, the recording layer contains the photopolymerizable composition and the color forming component A, and the color forming component B which is contained as the polymerizable compound in the photopolymerizable composition reacts with the color forming component A to form color.

Examples of the combination of the color forming component A and the color forming component B which are the color source constituting the image part include the following combinations (a) to (s). In the following combinations, the color forming component A and the color forming component B are shown in this order.

(a) Combination of an electron donating dye precursor and an electron accepting compound
(b) Combination of a diazo compound and a coupling component (hereinafter referred to as a "coupler compound")
(c) Combination of an organic acid metallic salt, such as silver behenate and silver stearate, and a reducing agent, such as protocatechinic acid, spiroindane and hydroquinone
(d) Combination of a long-chain fatty acid iron salt, such as ferric stearate and ferric myristate, and a phenol, such as tannic acid, gallic acid and ammonium salicylate
(e) Combination of an organic acid heavy metallic salt, such as a nickel, cobalt, lead, copper, iron, mercury or silver salt of acetic acid, stearic acid and palmitic acid, and an alkali metal or alkaline earth metal sulfide, such as calcium sulfide, strontium sulfide and potassium sulfide, or combination of the organic acid heavy metallic salt and an organic chelating agent, such as s-diphenyl carbazide and diphenylcarbazone
(f) Combination of a heavy metal sulfate, such as a sulfate of silver, lead, mercury and sodium, and a sulfur compound, such as sodium tetrathionate, sodium thiosulfate and thiourea
(g) Combination of a fatty acid ferric salt, such as ferric stearate, and an aromatic polyhydroxy compound, such as 3,4-hydroxytetraphenylmethane
(h) Combination of an organic acid metallic salt, such as silver oxalate and mercury oxalate, and an organic polyhydroxy compound, such as polyhydroxy alcohol, glycerin and glycol
(i) Combination of a fatty acid ferric salt, such as ferric pelargonate and ferric laurate, and thiocetylcarbamide or a isothiocetylcabamide derivative
(j) Combination of an organic acid lead salt, such as lead caproate, lead pelargonate and lead behenate, and a thiourea derivative, such as ethylene thiourea and N-dodecyl thiourea
(k) Combination of a higher fatty acid heavy metallic salt, such as ferric stearate and copper stearate, and zinc dialkyldithiocarbamate
(l) Combination forming a dioxazine, such as combination of resorcin and a nitroso compound
(m) Combination of a formazan compound and a reducing agent and/or a metallic salt
(n) Combination of a protected dye (or leuco dye) precursor and a deprotecting agent
(o) Combination of an oxygen type coloring agent and an oxidizing agent
(p) Combination of a phthalonitrile and a diiminoisoindoline (i.e., combination forming phthalocyanine)
(q) Combination of an isocyanate and a diiminoisoindoline (i.e., combination forming a colored pigment)
(r) Combination of a pigment precursor and an acid or a base (i.e., combination forming a pigment)
(s) Combination of a precursor of an oxidant of a paraphenylenediamine derivative or a paraaminophenyl derivative, and a coupling component (coupling compound)

As the combination of the two components as the coloring source, the combination (a) of an electron donating dye precursor and an electron accepting compound, the combination (b) of a diazo compound and a coupling component (hereinafter referred to as a "coupler compound"), the combination (n) of a protected dye (or leuco dye) precursor and a deprotecting agent, and the combination (s) of a precursor of an oxidant of a paraphenylenediamine derivative or a paraaminophenyl derivative, and a coupling component (coupling compound) are preferable. In other words, an electron donating dye precursor, a diazo compound, a dye precursor or a oxidant precursor is preferred as the color forming component A, and an electron accepting compound, a coupler compound or a deprotecting agent is preferred as the color forming component B.

In the case where an electron donating colorless dye precursor is used as the color forming component A, examples of the electron donating colorless dye precursor include a phthalide compound, a fluoran compound, a phenothiazine compound, an indolyl phthalide compound, a leucoauramine compound, a rhodamine lactam compound, a triphenylmethane compound, a triazene compound, a spiropyran compound, a pyridine compound, a pyrazine compound and a fluorene compound, which have been known for use in heat-sensitive paper and pressure-sensitive paper.

Examples of the phthalide compound include compounds described in U.S. Reissue Pat. No. 23,024, No. 3,491,111, No. 3,491,112, No. 3,491,116 and No. 3,509,174, and specific examples thereof include 3,3-bis(p-dimethylaminophenyl)-6-dimethylaminopthalide, 3,3-bis(p-diethylaminophenyl)phthalide, 3,3-bis(2-methyl-1-octylindol-3-yl)phthalide, 3-(4-dipropylamino-2-acetylaminophenyl)-3-(2-methyl-1-octylindol-3-yl)-4-azaphthalide, 3-(4-diethylamino-2-ethoxyphenyl)-3-(2-methyl-1-octylindol-3-yl)phthalide, 3-(4-diethylamino-2-ethoxyphenyl)-3-(2-methyl-1-octylindol-3-yl)-4-azaphthalide, 3-(4-diethylamino-2-methylphenyl)-3-(1-ethyl-2-methylindol-3-yl)-4azaphthalide, 3,3-bis(4-diethylamino-2-butyloxyphenyl)-4-azaphthalide and 3-(4-diethylamino-2-butyloxyphenyl)-3-(2-methyl-1-pentylindol-3-yl)-4-azaphthalide.

Examples of the fluoran compound include compounds described in U.S. Pat. No. 3,624,107, No. 3,627,787, No. 3,641,011, No. 3,462,828, No. 3,681,390, No. 3,920,510 and No. 3,959,571, and specific examples thereof include 2-anilino-3-methyl-6-diethylaminofluorane, 2-anilino-3-methyl-6-dibutylaminofluorane, 2-anilino-3-methyl-6-N-ethyl-N-isoamylaminofluorane, 2-anilino-3-methyl-6-N-methyl-N-cyclohexylaminofluorane, 2-anilino-3-methyl-6-N-ethyl-N-isobutylaminofluorane, 2-anilino-6-dibutylaminofluorane and 2-anilino-3-methyl-6-N-methyl-N-tetrahydrofurfurylaminofluorane.

Examples of the thiazine compound include benzoyl leucomethylene blue and p-nitrobenzyl leucomethylene blue.

Examples of the leucoauramine compound include 4,4'-bis-dimethylaminobenzhydrine benzyl ether, N-halophenyl-leucoauramine and N-2,4,5-trichlorophenyl leucoauramine.

Examples of the rhodamine lactam compound include rhodamine-B-anilinolactam and rhodamine-(p-nitro)lactam.

Examples of the spiropyran compound include compounds described in U.S. Pat. No. 3,971,808, and specific examples thereof include 3-methyl-spiro-dinaphthopyran, 3-ethyl-spiro-dinaphthopyran, 3,3'-dichloro-spiro-dinaphthopyran, 3-benzyl-spiro-dinaphthopyran, 3-methyl-naphtho-(3-methyoxybenzo)spiropyran and 3-propyl-spiro-dibenzopyran.

Examples of the pyridine compound and the pyrazine compound include compounds described in U.S. Pat. No. 3,775,424, No. 3,853,869 and No. 4,246,318.

Examples of the fluorene compound include compounds described in Japanese Patent Application No. 61-240989.

Examples of the dye precursor forming cyan, magenta or yellow color include dye precursors described in U.S. Pat. No. 4,800,149.

Examples of the dye precursor forming yellow color include dye precursors described in U.S. Pat. No. 4,800,148, No. 5,126,233 and JP-B-7-88105, and examples of the dye precursor forming cyan color include dye precursors described in JP-A-63-53542.

In the case where the electron donating dye precursor is used, an electron accepting compound is used as the color forming component B that causes the electron donating dye precursor to form color.

Examples of the electron accepting compound include a phenol derivative, a salicylic acid derivative, a metallic salt of an aromatic carboxylic acid, acid clay, bentonite, a novolak resin, a metal-treated novolak resin and a metallic complex, which are known for use in heat-sensitive paper and pressure-sensitive paper. They are specifically described in JP-B-40-9309, JP-B-45-14030, JP-A-52-140483, JP-A-48-51510, JP-A-57-210886, JP-A-58-87089, JP-A-59-11286, JP-A-60-176795 and JP-A-61-95988.

Among the foregoing, examples of the phenol derivative include 2,2-bis(4-hydroxyphenyl)propane, 1,1-bis(3-chloro-4-hydroxyphenyl)cyclohexane, 4-hydroxyphenyl-4'-isopropyloxyphenylsulfone, bis(3-allyl-4-hydroxyphenyl)sulfone, α,α'-bis(4-hydroxyphenyl)-1,4-diisopropylbenzene and benzyl p-hydroxybenzoate.

Examples of the salicylic acid derivative include 4-pentadecylsalicylic acid, 3,5-di(α-methylbenzyl)salicylic acid, 3,5-di(tert-octyl)salicylic acid, 5-octadecylsalicylic acid, 5-α-(p-α-methylbenzylphenyl)ethylsalicylic acid, 3-α-methylbenzyl-5-tert-octylsalicylic acid, 5-tetradecylsalycylic acid, 4-hexyloxysalicylic acid, 4-cyclohexyloxysalicylic acid, 4-decyloxysalicylic acid, 4-dodecyloxysalicylic acid, 4-pentadecyloxysalicylic acid, 4-octadecyloxysalicylic acid, and zinc, aluminum, calcium and copper salts thereof.

In the recording material of the first invention, the color forming component B functions as the polymerizable compound having an ethylenic unsaturated bond. Therefore, at least one of the polymerizable compounds of the first embodiment is an electron accepting compound, and an electron accepting group and an ethylenic unsaturated bond (hereinafter referred to as a polymerizabel group) are contained in the molecule thereof.

Examples of the color forming component B in this case include 3-halo-4-hydroxybenzoic acid described in JP-A-4-226455, methacryloxyethyl esters and acryloxyethyl esters of benzoic acid having a hydroxyl group described in JP-A-63-173682, esters of hydroxymethylstyrene and benzoic acid having a hydroxyl group described in JP-A-59-83693, JP-A-60-141587 and JP-A-62-99190, hydroxystyrene described in European Patent No. 29,323, N-vinylimidazole complexes of zinc halogenide described in JP-A-62-167077 and JP-A-62-16708, and electron accepting compounds described in JP-A-63-317558.

Among these compound having an electron accepting group and a polymerizable group in the same molecule, 3-halo-4-hydroxybenzic acid represented by the following general formula is preferred.

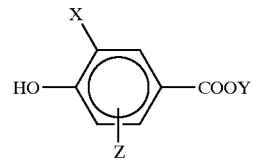

In the general formula, X represents a halogen atom, and preferably a chlorine atom. Y represents a monovalent group having a polymerizable ethylene group, preferably an aralkyl group having a vinyl group, an acryloyloxyalkyl group or a methacryloyloxyalkyl group, and more preferably an acryloyloxyalkyl group having from 5 to 11 carbon atoms or a methacryloyloxyalkyl group having from 6 to 12 carbon atoms. Z represents a hydrogen atom, an alkyl group or an alkoxy group.

Examples of the 3-halo-4-hydroxybenzoic acid include vinylphtnethyl 3-chloro-4-hydroxybenzoate, vinylphenyl-propyl 3-chloro-4-hydroxybenzoate, 2-acryloyloxyethyl 3-chloro-4-hydroxybenzoate, 2-methacryloyloxyethyl 3-chloro-4-hydroxybenzoate, 2-methacryloyloxypropyl 3-chloro-4-hydroxybenzoate, 3-acryloyloxypropyl 3-chloro-4-hydroxybenzoate, 3-methacryloyloxypropyl 3-chloro-4-hydroxybenzoate, 4-acryloyloxybutyl 3-chloro-4-hydroxybenzoate, 4-methacryloyloxybutyl 3-chloro-4-hydroxybenzoate, 2-acryloyloxyetnyl 3-chloro-4-hydroxybenzoate, 5-acryloyloxypentyl 3-chloro-4-hydroxybenzoate, 5-methacryloyloxypentyl 3-chloro-4-hydroxybenzoate, 6-acryloyloxyhexyl 3-chloro-4-hydroxybenzoate, 6-methacryloyloxyhexyl 3-chloro-4-hydroxybenzoate, 8-acryloyloxyoctyl 3-chloro-4-hydroxybenzoate and 8-methacryloyloxyoctyl 3-chloro-4-hydroxybenzoate.

Further examples thereof include styrene sulfonylaminosalicylic acid, vinylbenzyloxyphthalic acid, zinc β-methacryloxyethoxysalicylate, zinc β-acryloxyethoxysalicylate, vinyloxyethyloxybenzoic acid, β-methacryloxyethylorsellinate, β-acryloxyethylorsellinate, β-methacryloxyethoxyphenol, β-acryloxyethoxyphenol, β-methacryloxyethyl-β-resorcinate, β-acryloxyethyl-β-resorcinate, hydroxystyrene sulfonic acid N-ethylamide, β-methacryloxypropyl-p-hydroxybenzoate, β-acryloxypropyl-p-hydroxybenzoate, methacryloxymethylphenol, acryloxymethylphenol, methacrylamide propanesulfonic acid, acrylamide propanesulfonic acid, β-methacryloxyethoxydihydroxybenzene, β-acryloxyethoxydihydroxybenzene, γ-styrenesulfonyloxy-β-methacryloxpropanecarboxylic acid, γ-acryloxypropyl-α-hydroxyethyloxysalicylic acid, β-hydroxyethoxyphenol, β-methacryloxyethyl-p-hydroxycinnamate, β-acryloxyethyl-p-hydroxycinnamate, 3,5-distyrenesulfonic acid amidephenol, methacryloxyethoxyphthalic acid, acryloxyethoxyphthalic acid, methacrylic acid, acrylic acid, methacryloxyethoxyhydroxynaphthoic acid, acryloxyethoxyhydroxynaphthoic acid, 3-β-hydroxyethoxyphenol, β-methacryloxyethyl-p-hydroxybenzoate, β-acryloxyethylp-hydroxybenzoate, β'-methacryloxyethyl-β-resorcinate, β-methacryloxyethyloxycarbonylhydroxybenzoic acid, β-acryloxyethyloxycarbonylhydroxybenzoic acid, N,N'-di-β-methacryloxyethylaminosalicylic acid, N,N'-di-β-acryloxyethylaminosalicylic acid, N,N'-di-β-methacryloxyethylaminosulfonylsalicylic acid, N,N'-di-β-acryloxyethylaminosulfonylsalicylic acid, and metallic salt (such as a zinc salt) thereof.

In the case where an electron donating dye precursor is used as the color forming component A, and an electron accepting compound is used as the color forming component B, the content of the electron donating dye precursor in the recording layer is preferably from 0.05 to 5 g/m², and more preferably from 0.1 to 3 g/m².

The content of the electron accepting compound is preferably from 0.5 to 20 parts by weight, and more preferably from 3 to 10 parts by weight, per 1 part by weight of the electron donating colorless dye used. When the amount used is less than 0.5 part by weight, there are some cases where a sufficient coloring density cannot be obtained, and when it exceeds 20 parts by weight, there are some cases where the sensitivity is lowered, and the coating property is deteriorated.

In the case where a diazo compound is used as the color forming component A, a compound represented by the following general formula is preferably used:

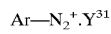

Ar—N$_2^+$·Y$^{31}$

Wherein Ar represents an aromatic ring group, and Y⁻ represents an acid anion.

In the forgoing general formula, Ar represents a substituted or unsubstituted aryl group. Examples of the substituent include an alkyl group, an alkoxy group, an alkylthio group, an aryl group, an aryloxy group, an arylthio group, an acyl group, an alkoxycarbonyl group, a carbamoyl group, a carboamide group, a sulfonyl group, a sulfamoyl group, a sulfonamide group, an ureido group, a halogen atom, an amino group and a heterocyclic group, and these substituents may be further substituted.

As the aryl group, an aryl group having from 6 to 30 carbon atoms is preferred, and examples thereof include a phenyl group, a 2-methylphenyl group, a 2-chlorophenyl group, a 2-methoxyphenyl group, a 2-butoxyphenyl group, a 2-(2-ethylhexyloxy)phenyl group, a 2-octyloxyphenyl group, a 3-(2,4-di-t-pentylphenoxyethoxy)phenyl group, a 4-chlorophenyl group, a 2,5-dichlorophenyl group, a 2,4,6-trimethylphenyl group, a 3-chlorophenyl group, a 3-methylphenyl group, a 3-methoxyphenyl group, a 3-butoxyphenyl group, a 3-cyanophenyl group, a 3-(2-ethylhexyloxy)phenyl group, a 3, 4-dichlorophenyl group, a 3,5-dichlorophenyl group, a 3,4-dimethoxyphenyl group, a 3-(dibutylaminocarbonylmethoxy)phenyl group, a 4-cyanophenyl group, a 4-methylphenyl group, a 4-methoxyphenyl group, a 4-butoxyphenyl group, a 4-(2-ethylhexyloxy)phenyl group, a 4-benzylphenyl group, a 4-aminosulfonylphenyl group, a 4-N,N-dibutylaminosulfonylphenyl group, a 4-ethoxycarbonylphenyl group, a 4-(2-ethylhexylcarbonyl)phenyl group, a 4-fluorophenyl group, a 3-acetylphenyl group, a 2-acetylaminophenyl group, a 4-(4-chlorophenylthio)phenyl group, a 4-(4-methylphenyl)thio-2,5-butoxyphenyl group and a 4-(N-benzyl-N-methylamino)-2-dodecylcarbonylphenyl group.

These groups may be further substituted with an alkyloxy group, an alkylthio group, a substituted phenyl group, a cyano group, a substituted amino group, a halogen atom or a heterocyclic group.

Examples of a diazo compound that can be preferably used as the color forming component A include diazo compounds described in the columns 44 to 49 of JP-A-7-276808, but the invention is not limited to these compounds.

The diazo compound preferably has a maximum absorption wavelength $\lambda_{max}$ of 450 nm or less from the standpoint of the effect of the invention, and it is more preferably from 290 to 440 nm. It is preferred that the diazo compound has 12 or more carbon atoms, has a solubility in water of 1% or less, and has a solubility in ethyl acetate of 5% or more.

The diazo compound as the color forming component A may be used solely or may be used in combination of two or more of them for various purpose, such as adjustment of hue.

In the case where the diazo compound is used, a coupler compound (having no polymerizable group) or a coupler compound having a polymerizable group is used as the color forming component B.

The coupler compounds form a dye through coupling with the diazo compound in a basic atmosphere and/or a neutral atmosphere, and they can be used in combination of plural kinds thereof for various purposes, such as adjustment of hue.

Specific examples of the coupler compound having a polymerizable group include an active methylene compound having a methylene group adjacent to a carbonyl group, a phenol derivative, a naphthol derivative, an azole derivative and a hetero-condensed ring azole derivative. They may be used through appropriate selection within the range conforming to the object of the invention.

As a coupler skeleton compound (coupler) in the coupler compound having a polymerizable group, such a coupler is preferably used as an active methylene compound having a methylene group adjacent to a carbonyl group, a phenol derivative, a naphthol derivative, an azole derivative and a hetero-condensed ring azole derivative. Specific examples thereof include resorcin, phloroglucin, 2,3-dihydroxynaphthalene, sodium 2,3-dihydroxynaphthalene-6-sulfonate, 1-hydroxy-2-naphthoic acid morpholinopropylamide, sodium 2-hydroxy-3-naphthalenesulfonate, 2-hydroxy-3-naphthalenesulfonic acid anilide, 2-hydroxy-3-naphthalenesulfonic acid morpholinopropylamide, 2-hydroxy-3-naphthalenesulfonic acid 2-ethylhexyloxypropylamide, 2-hydroxy-3-naphthalenesulfonic acid 2-ethylhexylamide, 5-acetamide-1-naphthol, sodium 1-hydroxy-8-acetamidenaphthalene-3,6-disulfonate, 1-hydroxy-8-aceamidenaphthalene-3,6-disulfonic acid dianilide, 1,5-dihydroxynaphthalene, 2-hydroxy-3-naphthoic acid morpholinopropylamide, 2-hydroxy-3-naphthoic acid octylamide, 2-hydroxy-3-naphthoic acid anilide, 5,5-dimethyl-1,3-cyclohexanedione, 1,3-cyclopentanedione, 5-(2-n-tetradecyloxyphenyl)-1,3-cyclohexanedione, 5-phenyl-4-methoxycarbonyl-1,3-cyclohexanedione, 5-(2,5-di-n-octyloxyphenyl)-1,3-cyclohexanedione, N,N'-dicyclohexylbarbituric acid, N,N'-di-n-dodecylbarbituric acid, N-n-octyl-N'-n-octadecylbarbituric acid, N-phenyl-N'-(2,5-di-n-octyloxyphenyl)barbituric acid, N,N'-bis(octadecyloxycarbonylmethyl)barbituric acid, 1-phenyl-3-methyl-5-pyrazolone, 1-(2,4,6-trichlorophenyl)-3-anilino-5-pyrazolone, 1-(2,4,6-trichlorophenyl)-3-benzamide-5-pyrazolone, 6-hydroxy-4-methyl-3-cyano-1-(2-ethylhexyl)-2-pyridone, 2,4-bis(benzoylacetamide)toluene, 1,3-bis(pivaloylacetamidemethyl)benzene, benzoylacetonitrile, thenoylacetonitrile, acetoanilide, benzoylacetoanilide, pivaloylacetoanilide, 2-chloro-5-(N-n-butylsulfamoyl)-1-pivaloylacetoamidebenzene, 1-(2-ethylhexyloxypropyl)-3-cyano-4-methyl-6-hydroxy-1,2-dihydropyridine-2-one, 1-(dodecyloxypropyl)-3-acetyl-4-methyl-6-hydroxy-1,2-dihydropyridine-2-one and 1-(4-n-octyloxyphenyl)-3-tert-butyl-5-aminopyrazole.

Details of the coupler compound can be referred in JP-A-4-201483, JP-A-7-223367, JP-A-7-223368, JP-A-7-323660, JP-A-5-278608, JP-A-5-297024, JP-A-6-18669, JP-A-6-18670, JP-A-7-316280, JP-A-9-216468, JP-A-9-216469, JP-A-9-319025, JP-A-10-035113, JP-A-10-193801 and JP-A-10-264532.

The coupler compound forms a dye through coupling with the diazo compound in a basic atmosphere and/or a neutral atmosphere and can be used as a combination of plural kinds of them depending on various purposes, such as adjustment of hue.

Specific examples of the coupler having a polymerizable group will be shown below. The invention is not limited to the examples.

B-1
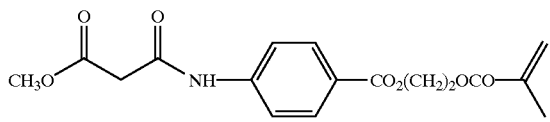

B-2
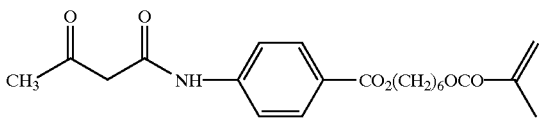

B-3
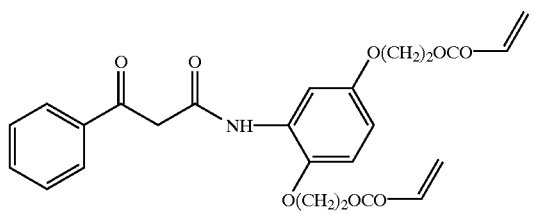

B-4
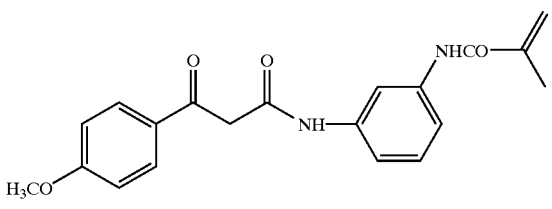

B-5
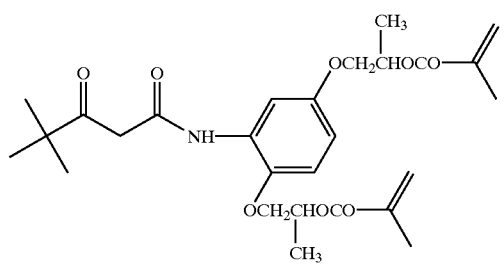

B-6
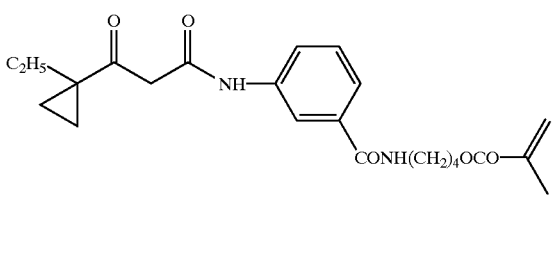

B-7
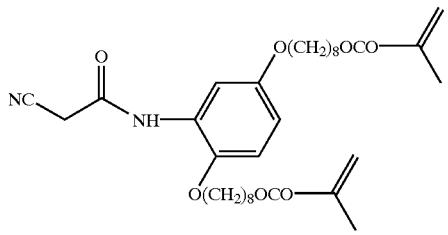

B-8
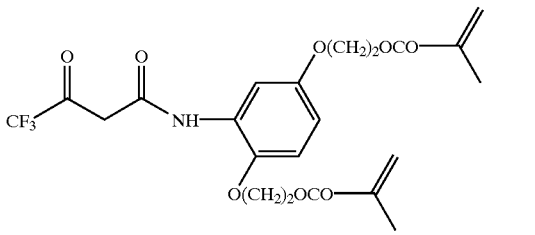

B-9
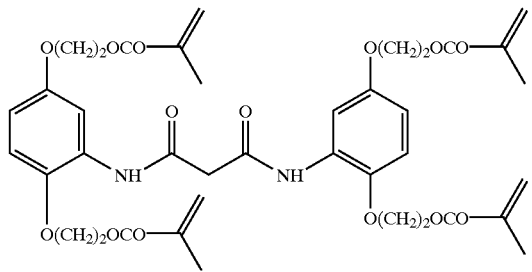

B-10
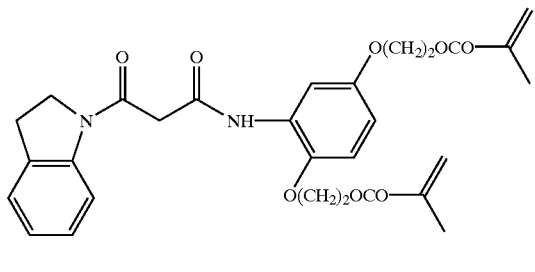

-continued
B-11
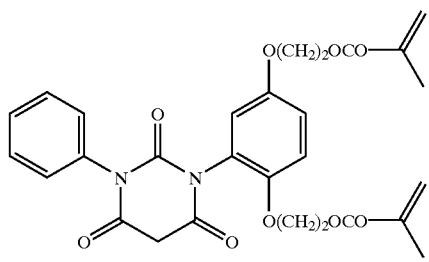
B-12
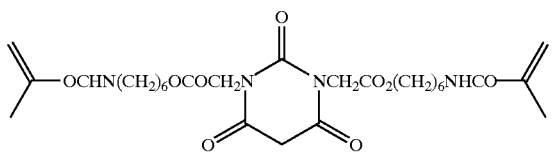
B-13
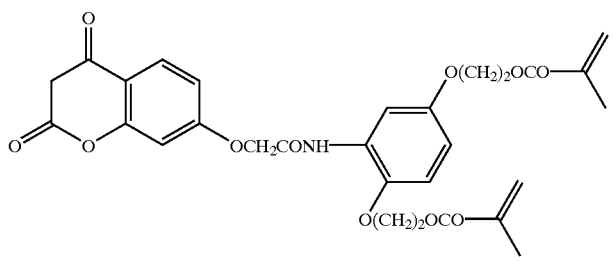
B-14
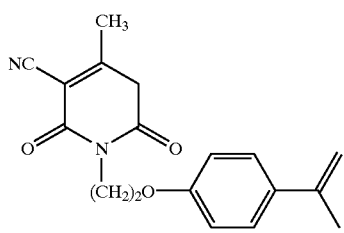
B-15
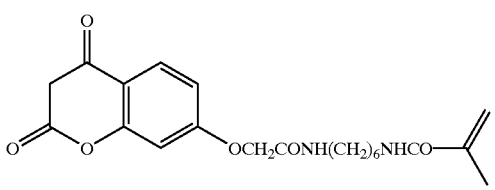
B-16
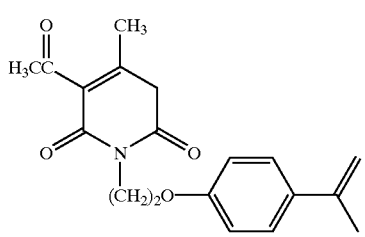
B-17
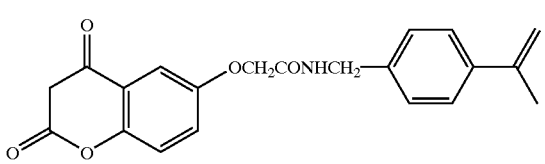
B-18
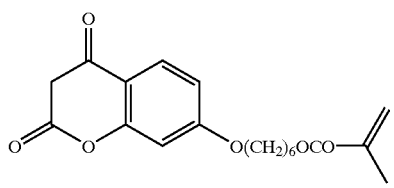
B-19
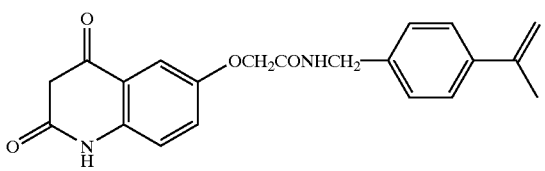
B-20
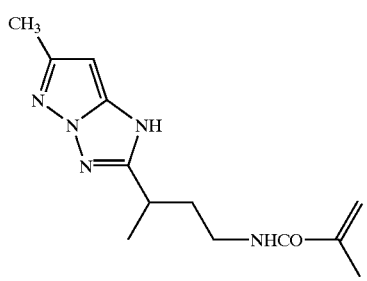
B-21
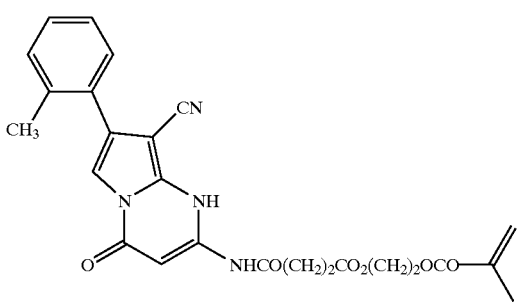

-continued
B-22
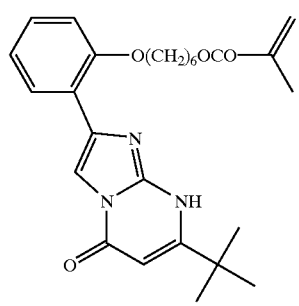
B-23
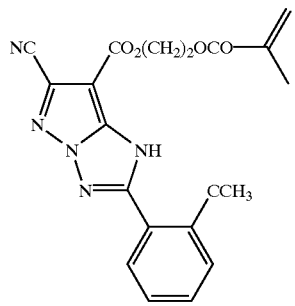
B-24
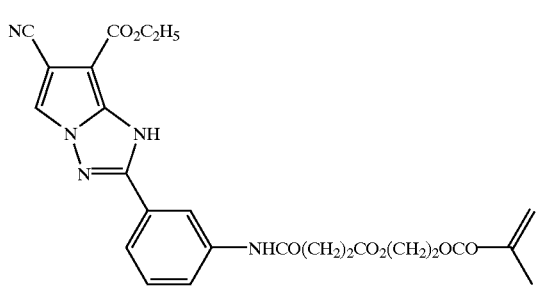
B-25
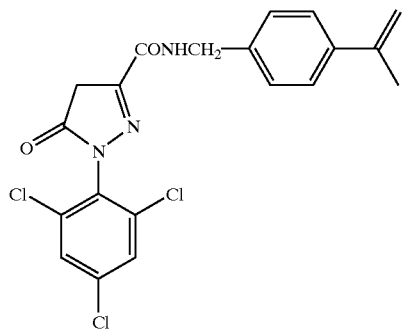
B-26
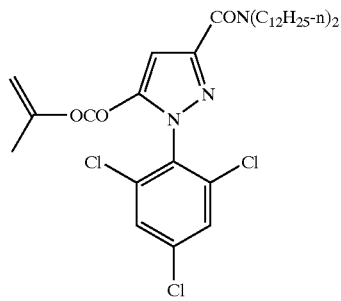
B-27
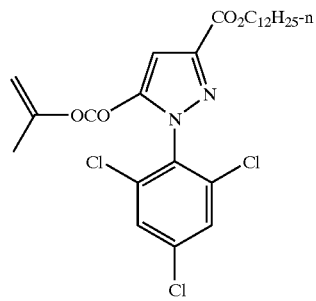
B-28
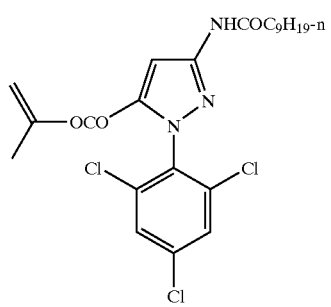
B-29
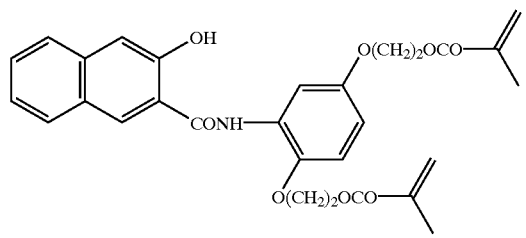
B-30
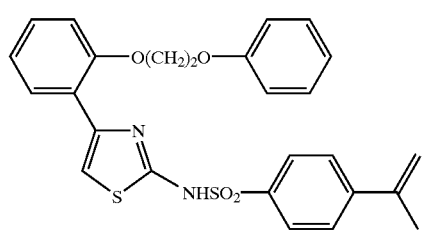
B-31
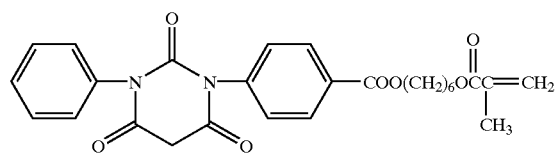

-continued

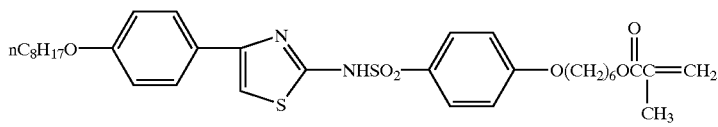

B-32

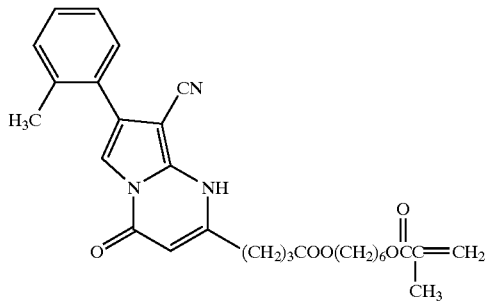

B-33

Examples of the coupler compound having no polymerizable group include those compound exemplified as the coupler skeleton compound for the coupler compound having a polymerizable group.

In the case where the diazo compound is used as the color forming component A, and the coupler is used as the color forming component B, the content of the diazo compound in the recording layer is preferably from 0.02 to 5.0 g/m², and more preferably from 0.05 to 3.0 g/m².

When the content is less than 0.02 g/m², there are some cases where a sufficient coloring density cannot be obtained, and when it exceeds 5.0 g/m², there are cases where the coating property of the coating composition is deteriorated.

The amount of the coupler used is preferably from 0.5 to 20 parts by weight, and more preferably from 1 to 10 parts by weight, for each 1 part by weight of the diazo compound. When the amount used is less than 0.5 part by weight, there are some cases where a sufficient coloring density cannot be obtained, and when it exceeds 20 parts by weight, there are some cases where the coating property is deteriorated.

The coupler compound used as the color forming component B can be used in such a manner that a water soluble polymer is added along with other component, and they are subjected to solid dispersion by using, for example, a sand mill, or alternatively, it can be used as a emulsion by emulsifying with a suitable emulsifying aid. The methods for the solid dispersion and the emulsification are not particularly limited, and known processes can be employed. Details of the methods are described in JP-A-59-190886, JP-A-2-141279 and JP-A-7-17145.

In order to accelerate the coupling reaction between the diazo compound and the coupler, it is preferred to use an organic base, such as a tertiary amine, a piperidine, a piperazine, an amidine, a formamidine, a pyridine, a guanidine and a morpholine.

Examples of the organic base include a piperazine, such as N,N'-bis(3-phenoxy-2-hydroxypropyl)piperazine, N,N'-bis(3-(p-methylphenoxy)-2-hydroxypropyl)piperazine, N,N'-bis(3-(p-methoxyphenoxy)-2-hydroxypropyl)piperazine, N,N'-bis(3-phenylthio-2-hydroxypropyl)piperazine, N,N'-bis(3-(β-naphthoxy)-2-hydroxypropyl)piperazine, N-3-(β-naphthoxy)-2-hydroxypropyl-N'-methylpiperazine and 1,4-bis((3-(N-methylpiperazino)-2-hydroxy)propyloxy)benzene; a morpholine, such as N-(3-(β-naphthoxy)-2-hydroxy)propylmorpholine, 1,4-bis((3-morpholino-2-hydroxy)propyloxy)benzene and 1,3-bis((3-morpholino-2-hydroxy)propyloxy)benzene; a piperidine, such as N-(3-phenoxy-2-hydroxypropyl)piperidine and N-dodecylpiperidine; triphenylguanidine, tricyclohexylguanidine, dicyclohexylphenylguanidine, 2-N-methyl-N-benzylaminoethyl 4-hydroxybenzoate, 2-N,N-di-n-butylaminoethyl 4-hydroxybenzoate, 4-(3-N,N-dibutylaminopropoxy)benzenesulfonamide and 4-(2-N,N-dibutylaminoethoxycarbonyl)phenoxyacetic acid amide.

These organic bases can be used solely or in combination of two or more of them.

These are described in JP-A-57-123086, JP-A-60-49991, JP-A-60-94381, JP-A-7-228731, JP-A-7-235157 and JP-A-7-235158.

In the case where the foregoing organic bases are used, an organic base having a polymerizable group can be used as the organic base.

In the case where an organic base having a polymerizable group is used in the recording material of the first embodiment, the diazo compound and the coupler are contained in microcapsules as the color forming component A, and the organic base having a polymerizable group can be used as the color forming component B. In the case where the diazo compound and the coupler are contained in microcapsules as the color forming component A, the combination of the diazo compound and the coupler is selected in such a manner that no coloring reaction occurs unless a base is present.

In the recording material of the first embodiment, the diazo compound is used as the color forming component A, and the coupler having a polymerizable group and the organic base having a polymerizable group are used in combination as the color forming component B.

The amount of the organic base used is not particularly limited, and it is preferably from 1 to 30 mole per 1 mole of the diazo compound.

Furthermore, in order to accelerate the coloring reaction, a color-formation aid may be added. Examples of the color-formation aid include a phenol derivative, a naphthol derivative, an alkoxy-substituted benzene, an alkoxy-substituted naphthalene, a hydroxy compound, a carboxylic acid amide compound and a sulfonamide compound.

The polymerizable compound used in the recording material of the second embodiment will be described below.

In the recording material of the second embodiment, the recording layer contains, as the polymerizable compound, a color-formation suppressing compound having an ethylenic unsaturated bond and a site that suppresses the reaction between the color forming component A and the color forming component B causing the color forming component A to form color through reaction in the same molecule (hereinafter sometimes referred to as a "polymerizable color-formation suppressing compound").

In the case where the electron donating dye precursor is used as the color forming component A, and the electron accepting compound having no polymerizable group is used as the color forming component B, it is preferred to use, as the polymerizable coloring suppressing compound, a photopolymerizable monomer having a site that suppresses the reaction between the electron donating dye precursor and the electron accepting compound and at least one vinyl group in the molecule (hereinafter sometimes referred to as a "photopolymerizable monomer $D_1$").

Specific examples of the photopolymerizable monomer $D_1$ include acrylic acid and a salt thereof, an acrylate, an acrylamide, methacrylic acid and a salt thereof, a methacrylate, a methacrylamide, maleic anhydride, a maleate, itaconic acid, an itaconate, a styrene compound, a vinyl ether, a vinyl ester, an N-vinyl heterocyclic compound, an allyl ether and an allyl ester.

Among these, a compound having plural vinyl groups in the molecule is preferred, and specifically, an acrylate and a methacrylate of a polyhydric alcohol, such as trimethylolpropane and pentaerythritol; an acrylate and a methacrylate of a polyvalent phenol and a bisphenol, such as resorcinol, pyrogallol and phloroglucinol; an acrylate or epoxy resin terminating with methacrylate; and an acrylate or polyester terminating with methacrylate are preferred.

Among these, ethylene glycol diacrylate, ethylene glycol dimethacrylate, trimethylolpropane triacrylate, pentaerythritol tetraacrylate, dipentaerythritol hydroxypentaacrylate, hexanediol-1,6-dimethacrylate and diethylene glycol dimethacrylate are particularly preferred.

The photopolymerizable monomer $D_1$ preferably has a molecular weight of about from 100 to 5,000, and more preferably about from 300 to 2,000.

In the case where the photopolymerizable monomer $D_1$ is used as the polymerizable coloring suppressing compound, the amount thereof used is preferably from 0.1 to 10 parts by weight, and more preferably from 0.5 to 5 parts by weight, per 1 part by weight of the electron donating compound used in combination with the coupler compound having no polymerizable group. When the amount used is less than 0.1 part by weight, there are some cases where a latent image is not formed in the exposing step, and when it exceeds 10 parts by weight, there are some cases where the coloring density is lowered.

In the case where the diazo compound is used as the color forming component A, and the coupler compound having no polymerizable group is used as the color forming component B, it is preferred to use, as the polymerizable coloring suppressing compound, a photopolymerizable monomer having an acidic group that suppresses the coupling reaction between the diazo compound and the coupler compound and at least one vinyl group in the molecule (hereinafter sometimes referred to as a "photopolymerizable monomer $D_2$").

Preferred examples of the photopolymerizable monomer $D_2$ include styrenesulfonylaminosalicylic acid, vinylbenzyloxyphthalic acid, zinc β-methacryloxyethoxysalicylate, zinc β-acryloxyethoxysalicylate, vinyloxyethyloxybenzoic acid, β-methacryloxyethylorsellinate, β-acryloxyethylorsellinate, β-methacryloxyethoxyphenol, β-acryloxyethoxyphenol, β-methacryloxyethyl-β-resorcinate, β-acryloxyethyl-β-resorcinate, hydroxystyrene-sulfonic acid N-ethylamide, β-methacryloxypropyl-p-hydroxybenzoate, β-acryloxypropyl-p-hydroxybenzoate, methacryloxymethylphenol, acryloxymethylphenol, methacrylamide propanesulfonic acid, acrylamide propanesulfonic acid, β-methacryloxyethoxydihydroxybenzene, β-acryloxyethoxydihydroxybenzene, γ-styrenesulfonyloxy-β-methacryloxypropane carboxylic acid, γ-acryloxypropyl-α-hydroxyethyloxysalicylic acid, β-hydroxyethoxyphenol, β-methacryloxyethyl-p-hydroxycinnamate, β-acryloxyethyl-p-hydroxycinnamate, 3,5-distyrenesulfonic acid amidephenol, methacryloxyethoxyphthalic acid, acryloxyethoxyphthalic acid, methacrylic acid, acrylic acid, methacryloxyethoxyhydroxynaphthoic acid, acryloxyethoxyhydroxynaphthoic acid, 3-β-hydorxyethoxyphenol, β-methacryloxyethyl-p-hydroxynbenzoate, β-acryloxyethyl-p-hydroxybenzoate, β'-methacryloxyethyl-β-resorcinate, β-methacryloxyethyloxycarbonylhydroxybenzoic acid, β-acryloxyethyloxycarbonylhydroxybenzoic acid, N,N-di-β-methacryloxyethylaminosalicylic acid, N,N-di-β-acryloxyethylaminosalicylic acid, N,N-di-β-methacryloxyethylaminosulfonylsalicylic acid and N,N-di-β-acryloxyethylaminosulfonylsalicylic acid.

In the case where the photopolymerizable monomer $D_2$ is used as the polymerizable coloring suppressing compound, the amount used thereof is preferably 0.1 to 10 parts by weight, and more preferably from 0.5 to 5 parts by weight, for each 1 part by weight of the coupler compound used in combination with the coupler compound having no polymerizable group. When the amount used is less than 0.1 part by weight, there are some cases where a latent image fails to form in the exposing step, and when it exceeds 10 parts by weight, there are some cases where the coloring density is lowered.

Microcapsules

In the recording material of the invention, it is preferred that the color forming component A is contained in the recording layer in such a state that the color forming component A is contained in microcapsules.

As a method for microcapsulation, known methods can be employed. Examples thereof include a method utilizing coacervation of a hydrophilic wall forming material described in U.S. Pat. No. 2,800,457 and No. 2,800,458; an interface polymerization method described in U.S. Pat. No. 3,287,154, British Patent No. 990,443, JP-B-38-19574, JP-B-42-446 and JP-B-42-771; a method by polymer deposition described in U.S. Pat. No. 3,418,250 and No. 3,660,304; a method using an isocyanate polyol wall material described in U.S. Pat. No. 3,796,669; a method using an isocyanate wall material described in U.S. Pat. No. 3,914,511; a method using a urea-formaldehyde type wall forming material or a urea formaldehyde-resorcinol type wall forming material described in U.S. Pat. No. 4,001,140, No. 4,087,376 and No. 4,089,802; a method using a wall forming material, such as a melamine-formaldehyde resin and hydroxypropyl cellulose, described in U.S. Pat. No. 4,025,455; an in situ process by polymerization of a monomer described in JP-B-36-9168 and JP-A-51-9079; an electrolytic dispersion cooling method described in British Pat. No. 952,807 and No. 965,074; and a spray drying method described in U.S. Pat. No. 3,111,407 and British Patent No. 930,422.

The method for microcapsulation is not limited to the foregoing methods. In particular, it is preferred to employ an interface polymerization method including the following procedures. The color forming component A is dissolved or dispersed in a hydrophobic organic solvent, which becomes a core of capsules, to form an oily phase. The oily phase is mixed with an aqueous phase formed by dissolving a water soluble polymer. The mixture is subjected to emulsion dispersion by means, such as a homogenizer, and then heated to effect a polymer forming reaction at an interface of oil droplets, so as to form a microcapsule wall of a polymer substance. According to the method, capsules having a uniform particle diameter can be formed in a short period of time, and a recording material excellent in storage stability is formed.

Reactants forming the polymer are added to the interior of the oil droplets and/or the exterior of the oil droplets. Examples of the polymer substance include polyurethane, polyurea, polyamide, polyester, polycarbonate, a urea-formaldehyde resin, a melamine resin, polystyrene, a styrene-methacrylate copolymer and a styrene-acrylate copolymer. Among these, polyurethane, polyurea, polyamide, polyester and polycarbonate are preferred, and polyurethane and polyurea are particularly preferred. These polymer substances may be used in combination of two or more of them.

Examples of the water soluble polymer include gelatin, polyvinyl pyrrolidone and polyvinyl alcohol. For example, in the case where polyurethane is used as the capsule wall material, a polyvalent isocyanate and a second material forming the capsule wall through reaction with the polyvalent isocyanate (such as polyol and polyamine) are mixed with an aqueous solution of a water soluble polymer (aqueous phase) or an oily medium to be encapsulated (oily phase), followed by emulsion dispersion, and then a polymer forming reaction is effected at an interface of the oil droplets by heating, whereby the microcapsule wall is thus formed.

Examples of the polyol and the polyamine to be reacted with the polyvalent isocyanate include those described in U.S. Pat. No. 3,281,383, No. 3,773,695, No. 3,793,268, JP-B-48-40347, JP-B-49-24159, JP-A-48-80191 and JP-A-48-84086.

In the case where microcapsules containing the color forming component A are prepared, the color forming component A contained in the microcapsules may be present in either the form of liquid or the form of solid.

In the case where the color forming component A is contained in the microcapsules in the form of a solution, a solution of the color forming component A dissolved in a hydrophobic organic solvent may be encapsulated. The amount used of the organic solvent is preferably from 1 to 500 parts by weight per 100 parts by weight of the color forming component A.

Examples of the hydrophobic organic solvent generally include a phosphate, a phthalate, an acrylate, a methacrylate, esters of other carboxylic acids, a fatty acid amide, an alkylated biphenyl, an alkylated terphenyl, chlorinated paraffin, an alkylated naphthalene, diallylethane, a compound in a solid state at ordinary temperature, an oligomer oil and a polymer oil. Specific examples thereof include organic solvents described in JP-A-59-178451 to JP-A-59-178455, JP-A-59-178457, JP-A-60-242094, JP-A-63-85633, JP-A-6-194825, JP-A-7-13310, JP-A-7-13311, JP-A-9-106039 and the specification of Japanese Patent Application No. 62-75409.

In the case where the solubility in the organic solvent of the color forming component A to be encapsulated is poor, a low boiling point solvent exhibiting high solubility may be used in combination to aid dissolution. Examples of the low boiling point solvent include ethyl acetate, propyl acetate, isopropyl acetate, butyl acetate and methylene chloride.

An aqueous solution having a water soluble polymer dissolved therein is used as the aqueous phase, and after adding the oily phase thereto, emulsion dispersion is effected by means, such as a homogenizer. The water soluble polymer makes the dispersion uniform and easy, and also functions as a dispersant stabilizing the aqueous solution thus dispersed and emulsified. In order to further uniformly carry out emulsion dispersion for stabilization, a surface active agent may be added to at least one of the oily phase and the aqueous phase. As the surface active agent, known surface active agents for emulsification can be used. In the case where the surface active agent is added, the addition amount of the surface active agent is preferably from 0.1 to 5%, and particularly from 0.5 to 2%, based on the weight of the oily phase.

In the case where the color forming component A is microcapsulated, the average particle diameter of the microcapsules is preferably 20 $\mu$m or less, and more preferably 5 $\mu$m or less from the standpoint of obtaining high resolution. When the microcapsules thus formed are too small, the surface area per unit solid content becomes large thus requiring a large amount of the wall material, and therefore, the average particle diameter is preferably 0.1 $\mu$m or more.

The photopolymerizable composition of the invention can be applied to, in addition to the recording material of the invention, wide variety of fields, such as inks, color filters, holograms, proofs, sealants, adhesive, lithographic printing, resin relief printing and photoresists, and may contain other components depending on the respective purposes. In the case where the photopolymerizable composition is used for other purposes than the recording material of the invention, the polymerizable compound does not necessarily function as the color forming component B or the coloring suppressing compound, and a wide variety of polymerizable compounds having an ethylenic unsaturated bond can be utilized.

A multi-color recording material can be formed by superposing plural monochrome recording layer on a support. The recording layers respectively contain the color forming components A (which may be contained in microcapsules) having different coloring hues, the color forming components B (which may have a polymerizable group) having sites with which the respective color forming components A react to form color, and the photopolymerizable compositions forming latent images through exposure to light of different wavelengths. That is, photopolymerizable compositions that are sensitive to light of different wavelengths can be obtained by using the spectral sensitizing dyes having different absorption wavelengths in the photopolymerizable compositions. In this case, an intermediate layer may be provided between the monochrome recording layers.

The recording layers of the multi-color and multi-layer recording material of the invention can be formed, for example, in the following manner.

A first recording layer is formed on a support. The first recording layer contains microcapsules containing a color forming component $A^Y$ forming yellow color, a color forming component $B^Y$ that causes the color forming component $A^Y$ to form color, and a photopolymerizable composition forming a latent image through exposure to light of a center wavelength $\lambda_1$. A second recording layer is formed on the first recording layer. The second recording layer contains microcapsules containing a color forming component $A^M$ forming magenta color, a color forming component $B^M$ that causes the color forming component $A^M$ to form color, and a photopolymerizable composition forming a latent image through exposure to light of a center wavelength $\lambda_2$. A third recording layer is formed on the second recording layer to complete the multi-layer structure. The third recording layer contains microcapsules containing a color forming component $A^C$ forming cyan color, a color forming component $B^C$ that causes the color forming component $A^C$ to form color, and a photopolymerizable composition forming a latent image through exposure to light of a center wavelength $\lambda_3$. Thus, the formation of a multi-layer recording layer α is completed. Furthermore, depending on necessity, a multi-layer recording layer β can be structured to have intermediate layers between the respective layers of the multi-layer recording layer α.

In the case where image formation is carried out by using the recording material having the multi-color and multi-layer recording layer, imagewise exposure is carried out by using plural light sources having different wavelengths which correspond to the absorption wavelengths of the recording layers respectively, and thus the recording layers having the absorption wavelengths which correspond to the light sources selectively form latent images, whereby a multi-color image can be formed with high sensitivity and high sharpness. Furthermore, by irradiating the whole surface of the recording layer with light, the coloring on the background part caused by the photopolymerizable compositions such as the spectral sensitizing dyes remaining in the layers can be removed, whereby a multi-color image of high contrast can be formed.

Support

As the support, any paper support that is used for ordinary pressure-sensitive paper, heat-sensitive paper and dry or wet diazo duplicating paper can be used. Furthermore, acid paper, neutral paper, coated paper, plastic film-laminated paper, synthetic paper and a plastic film can also be used.

The recording material of the invention can be preferably used in planographic printing, resin relief printing, a resist and a photomask for producing a printing plate, and monochrome and color transfer coloring sheet and coloring sheet. For example, in the case where the recording material of the invention is applied to a light and heat sensitive coloring sheet, the coloring sheet can be produced in such a manner that the respective components are dissolved or dispersed in suitable solvents separately or in combination of some kinds of them to prepare solutions or dispersions, which are then mixed to form a coating composition, and the coating composition is coated on a support, such as paper and a plastic film, and then dried. For example, in the case where a prescribed component is contained in microcapsules, a microcapsule dispersion containing the component is prepared, and separately, a liquid having the other component dispersed or dissolved in a solvent is prepared, which are then mixed to form a coating composition. Upon preparing the coating composition, suitable dispersion states of the respective components can be obtained by using, for example, a homogenizer.

The methods for coating and drying can be carried out according to the conventionally known methods.

Image formation can be carried out on the recording material of the invention by subjecting it to a heat developing treatment simultaneously with or after the exposure for forming a latent image.

The heating method for the heat developing treatment can be in accordance with conventionally known methods. In general, the heating temperature is preferably from 80 to 200° C., and more preferably from 85 to 130° C. The heating time is preferably from 1 second to 5 minutes, and more preferably from 3 seconds to 1 minute.

After the heat developing treatment, it is preferred that the whole surface of the recording layer is irradiated with light, whereby the non-polymerized region is polymerized to effect fixation, and simultaneously, such a component remaining in the recording layer that lowers the whiteness of the background part, such as the spectral sensitizing dye, is decolorized, decomposed or inactivated.

In the recording material of the invention, by using an image fixing treatment that is shorter than the conventional process, color is prevented from remaining in the background part and thus whiteness of the background part is improved.

Upon carrying out image formation according to the foregoing method, the sensitivity can be further improved by providing a step of uniformly preheating, during the image formation, the whole surface of the recording material to a temperature lower than the coloring temperature. The recording material of the invention can also be applied to other known recording methods in addition to the foregoing recording method.

As described in the foregoing, using the photopolymerizable composition and the recording material of the invention, an image recording can be carried out with high sensitivity by using not only ultraviolet light but also light in the range from visible light to infrared light in a completely dry system in which a developing solution is not used, thus generating no waste. Also the decolorization property on the non-image part (background part) is excellent, and thus a sharp monochrome or color image with high contrast is formed.

The invention will be further described in more detail with reference to the following examples, but the invention should not be construed as being limited thereto. In the examples, percent is percent by weight, and part is part by weight, unless indicated otherwise.

The synthesis of the organic dyes (compounds represented by the general formula (I)) in the examples were carried out according to the known synthesis methods.

EXAMPLES 1 TO 10

As shown in Table 1 below, photopolymerizable compositions having the following compositions were prepared by using the organic dyes (compounds represented by the general formula (I), i.e., spectral sensitizing dyes) and the organic boron compounds exemplified in the foregoing.

| Composition of Photopolymerizable Composition | |
|---|---|
| Pentaerythritol tetraacrylate | 1.41 g |
| Benzyl methacrylate-methacrylic acid copolymer (73/27 by mole) | 1.29 g |
| Methyl ethyl ketone | 12 g |
| Propylene glycol monomethyl ether acetate | 8.62 g |
| Organic dye (example compound, see Table 1 below) | $1 \times 10^{-4}$ mole |
| Organic boron compound (see Table 1 below) | $6 \times 10^{-4}$ mole |
| Methanol | 6 g |

The structures of the borates (1) and (2) in Tables 1 and 2 are shown below.

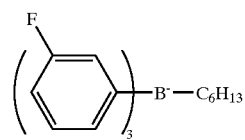

Borate (1)

Borate (2)

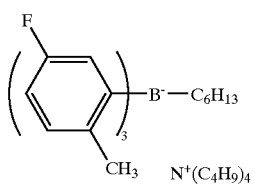

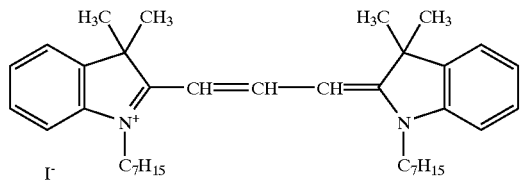
d-2

Each of the photopolymerizable compositions thus prepared was coated on a polyethylene terephthalate film of 100 μm to a thickness of 2 μm, and then drying was carried out at 100° C. for 5 minutes. The following protective layer coating composition (1) was coated thereon to a thickness of 1 μm, and then drying was carried out at 100° C. for 2 minutes, whereby photosensitive materials (1) to (10) according to the invention were produced.

| Composition of Protective Layer Coating Composition (1) | |
|---|---|
| Water | 98 g |
| Polyvinyl alcohol | 1.7 g |
| Hydroxypropylmethyl cellulose | 1.7 g |
| Polyvinyl pyrrolidone | 8.7 g |

COMPARATIVE EXAMPLES 1 TO 3 photosensitive materials (11) and (12) were produced in the same manner as in Example 1 except that the organic dye (example compound No. 2) used in Example 1 was replaced by the following organic dye d-1 or d-2 (spectral sensitizing dye) as shown in Table 1

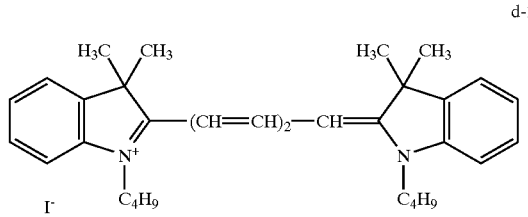
d-1

Image Formation and Evaluation

The photosensitive materials (1) to (10) according to the invention and the photosensitive materials (11) and (12) of Comparative Examples thus produced were exposed by using a vacuum printing frame device. The exposure of the photosensitive materials was carried out by irradiating the photosensitive materials with a 500-W xenon lamp (produced by Ushio, Inc.) through a step wedge (density step: 0.15, number of density steps: 1 to 15 steps, "Fuji Step Guide P" produced by Fuji Photo Film Co., Ltd.) and "SC38Filter" (a sharp cutting filter cutting light below 380 nm, produced by Fuji Photo Film Co., Ltd.) for 10 seconds. After the exposure, the photosensitive materials were developed with a developer solution having the following composition.

| Composition of Developer Solution | |
|---|---|
| Sodium carbonic anhydride | 10 g |
| Butyl cellosolve | 5 g |
| Water | 11 g |

Since the exposure amount on the region corresponding to the higher steps of the step wedge was small, the photopolymerizable composition in the region was eluted into the developer solution by the development, and the surface of the polyethylene terephthalate (PET) was exposed. The regions where the photopolymerizable composition was completely eluted to expose the PET surface were examined for the photosensitive materials of Examples and Comparative Examples, and the number of steps of the step wedge corresponding to the region with the largest exposure amount (number of clear steps) were obtained. The larger the number of steps, the higher the sensitivity of the photosensitive material was. The results are shown in Table 1.

The numbers in the organic dye column in Table 1 correspond to the number of the example compounds represented by the general formula (I). The same applies to Table 2.

TABLE 1

| | Photosensitive material | Organic dye | Organic boron compound | Maximum absorption wavelength (nm) | Number of clear steps |
|---|---|---|---|---|---|
| Example 1 | (1) | No. 3 | borate 1 | 548 | 10 |
| Example 2 | (2) | No. 3 | borate 2 | 548 | 11 |
| Example 3 | (3) | No. 4 | borate 1 | 556 | 10 |
| Example 4 | (4) | No. 5 | borate 1 | 549 | 10 |
| Example 5 | (5) | No. 7 | borate 2 | 557 | 11 |
| Example 6 | (6) | No. 9 | borate 2 | 590 | 10 |
| Example 7 | (7) | No. 13 | borate 2 | 582 | 9 |
| Example 8 | (8) | No. 28 | borate 2 | 643 | 11 |
| Example 9 | (9) | No. 31 | borate 2 | 782 | 8 |
| Example 10 | (10) | No. 32 | borate 2 | 790 | 8 |
| Comparative Example 1 | (11) | d-1 | borate 1 | 650 | 5 |
| Comparative Example 2 | (12) | d-2 | borate 1 | 560 | 4 |

It is understood from the result shown in Table 1 that the photosensitive materials (1) to (10) according to the invention using the compounds represented by the general formula (I) as the organic dye provide high sensitivity.

On the other hand, the photosensitive materials (11) and (12) of Comparative Examples, which do not use the organic dye defined in the invention, do not provide high sensitivity.

EXAMPLE 11

Preparation of Microcapsule Solution Containing an Electron Donating Colorless Dye (1-a) Preparation of Microcapsule Solution Containing an Electron Donating Colorless Dye (1)

8.9 g of the following electron donating colorless dye (1) was dissolved in 16.9 g of ethyl acetate, and 20 g of "Takenate D-110N" (produced by Takeda Chemical Industries, Ltd.) and 2 g of "Millionate MR200" (produced by Nippon Polyurethane Co., Ltd.) as capsulating agents were added thereto. The solution was added to a mixed solution of 42 g of 8%-phthalated gelatin and 1.4 g of a 10% sodium benzenesulfonate solution, and they were subjected to emulsion dispersion at 20° C. to obtain an emulsion. 14 g of water and 72 g of a 2.9% tetraethylenepentamine aqueous solution were added to the resulting emulsion, which was heated to 60° C. while being stirred, to obtain, after 2 hours, a microcapsule solution having an average particle diameter of 0.5 μm and containing the electron donating colorless dye (1).

Electron donating colorless dye (1)

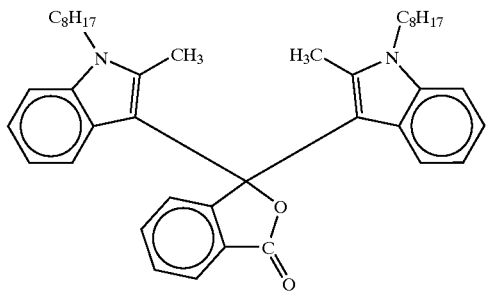

Preparation of an Emulsion of a Photopolymerizable Composition (2-a) Preparation of an Emulsion of a Photopolymerizable Composition 5.3 g of isopropyl acetate was added to 0.05 g of the organic dye (example compound No. 3, see Table 2 below), 0.3 g of the borate (2) (organic boron compound), 0.05 g of the following polymerization aid (1) and 4.2 g of the following polymerizable electron accepting compound (1), and then dissolved by stirring.

Polymerization aid (1)

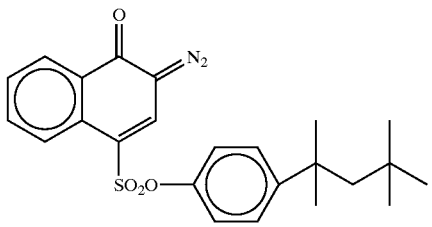

-continued
Polymerizable electron accepting compound (1)

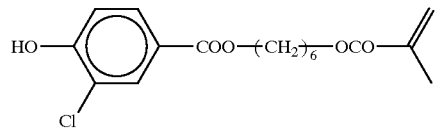

The solution was added to a mixed solution of 13 g of a 8% gelatin aqueous solution, 0.8 g of a 2% aqueous solution of the following surface active agent (1) and 0.8 g of a 2% aqueous solution of the following surface active agent (2), and was emulsified by a homogenizer (produced by Nippon Seiki Co., Ltd.) at 10,000 rpm for 5 minutes, so as to obtain an emulsion of a photopolymerizable composition.

Surface active agent (1)

$C_9H_{19}$—⟨⟩—$O(CH_2)_4SO_3Na$

Surface active agent (2)

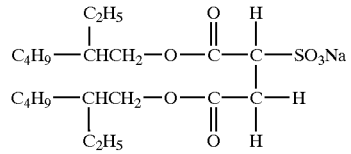

Preparation of a Coating Composition for the Recording Layer (3-a) Preparation of a Coating Composition for the Recording Layer 4 g of the electron donating colorless dye capsule solution, 12 g of the emulsion of a photopolymerizable composition and 12 g of a 15% gelatin aqueous solution were mixed to prepare a coating composition for the recording layer. Preparation of a Coating Composition for a Protective Layer (2)

(4-a) Preparation of a Coating Composition for a Protective Layer (2)

4.5 g of a 10% gelatin aqueous solution, 4.5 g of distilled water, 0.5 g of a 2% aqueous solution of the following surface active agent (4), 0.5 g of a 2% aqueous solution of the following hardening agent (1), "Syloid 72" (produced by Fuji-Devison Chemical, Ltd.) in an amount providing a coating amount of 50 mg/m², and 1 g of "Snowtex N" were mixed to prepare a coating composition for a protective layer (2).

Surface active agent (3)

Surface active agent (4)

$C_9H_{19}$—⟨⟩—$O(CH_2CH_2O)_3(CH_2)_4SO_3Na$

Hardening agent (1)

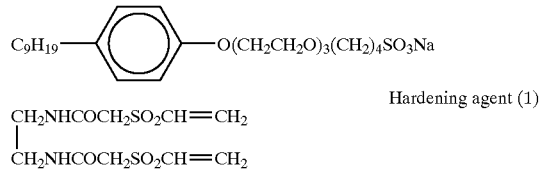

Support

A white polyester film filled with a white pigment having a thickness of 100 μm ("Lumirror E68L" produced by Toray Industries, Inc.) was prepared as a support. The coating composition for the recording layer was coated on the support such that a dry weight of the coated layer was 6 g/M², and, then dried at 30° C. for 10 minutes. The coating composition for the protective layer (2) was coated thereon such that a dry weight of the coated layer was 2 g/m², and then dried at 30° C. for 10 minutes, so as to obtain a light and heat sensitive recording material (a) according to the invention.

EXAMPLES 12 TO 17

Light and heat sensitive recording materials (b) to (g) were obtained in the same manner as in Example 11 except that the organic dye (example compound No. 3) and the organic boron compound (borate (2)) used in Example 11 were replaced by the organic dyes (compounds represented by the general formula (I), spectral sensitizing dyes) and the organic boron compounds shown in Table 2.

COMPARATIVE EXAMPLES 3 AND 4

Light and heat sensitive recording materials (h) and (i) were obtained in the same manner as in Example 11 except that the organic dye (example compound No. 3) used in Example 11 was replaced by the organic dyes d-1 and d-2.
Image Formation and Evaluation The light and heat sensitive recording materials (a) to (g) according to the invention and the light and heat sensitive recording materials (h) and (i) of Comparative Examples were irradiated with a 500-W xenon lamp through a step wedge and SC38 Filter for 30 seconds by using a vacuum printing frame device, so as to form latent images. When each of the light and heat sensitive recording materials was heated on a hot plate at 125° C. for 15 seconds, coloration in magenta, which was formed on reaction between the electron donating colorless dye (1) and the polymerizable electron accepting compound (1), occurred on the non-exposed part, but the coloring density was low, or no coloration occurred in the exposed part. The region in which there was no coloration was evaluated to obtain the number of steps of the step wedge corresponding to the region with the smallest exposure amount (number of clear steps). The larger the number of steps, the higher the sensitivity of the light and heat sensitive material was.

The results are shown in Table 2.

The light and heat sensitive recording materials were exposed to a fluorescent light (30,000 lux) for 10 minutes, and the densities of yellow, magenta and cyan in the background part were measured by a transmission Macbeth densitometer. As the decolorization property of the organic dyes with the exposure improved, the fog density on the background part became lower. The results are shown in Table 2.

TABLE 2

| | Photosensitive and heat-sensitive material | Organic dye | Organic boron compound | Maximum absorption wavelength (nm) | Number of clear steps | Fog density after exposure | | |
|---|---|---|---|---|---|---|---|---|
| | | | | | | Yellow | Magenta | Cyan |
| Example 11 | (a) | No. 3 | borate 1 | 548 | 10 | 0.06 | 0.06 | 0.06 |
| Example 12 | (b) | No. 4 | borate 1 | 556 | 10 | 0.05 | 0.07 | 0.06 |
| Example 13 | (c) | No. 8 | borate 1 | 550 | 11 | 0.05 | 0.07 | 0.07 |
| Example 14 | (d) | No. 17 | borate 2 | 575 | 9 | 0.05 | 0.08 | 0.07 |
| Example 15 | (e) | No. 21 | borate 2 | 580 | 10 | 0.05 | 0.08 | 0.06 |
| Example 16 | (f) | No. 28 | borate 2 | 643 | 12 | 0.06 | 0.06 | 0.06 |
| Example 17 | (g) | No. 30 | borate 2 | 792 | 9 | 0.06 | 0.06 | 0.07 |
| Comparative Example 3 | (h) | d-1 | borate 1 | 650 | 5 | 0.07 | 0.09 | 0.31 |
| Comparative Example 3 | (i) | d-2 | borate 1 | 560 | 4 | 0.07 | 0.44 | 0.05 |

It is understood from the result shown in Table 2 that the light and heat sensitive materials (a) to (g) according to the invention using the compounds represented by the general formula (I) as the organic dye provide high sensitivity and are excellent in decolorization property, whereby sharp images with high contrast can be obtained.

On the other hand, the photosensitive materials (h) and (i) of Comparative Examples, which do not use the organic dye defined in the invention, cannot provide high sensitivity and are poor in decolorization property.

As described in the foregoing, the invention provides a photopolymerizable composition that is highly sensitive not only to ultraviolet light, but also to visible light to infrared light. Furthermore, the invention also provides such a recording material for a completely dry treatment system in which no waste is generated and which is capable of carrying out image recording with high sensitivity by using not only ultraviolet light but also light in the range from visible light to infrared light which is excellent in decolorization of the non-image part (the background part), and is capable of forming a monochrome or color image with sharpness and high contrast.

What is claimed is:

1. A photopolymerizable composition comprising a polymerizable compound having an ethylenic unsaturated bond, a compound represented by the following general formula (I), and a radical generator capable of forming a radical by the action of said compound and said radical generator upon each other:

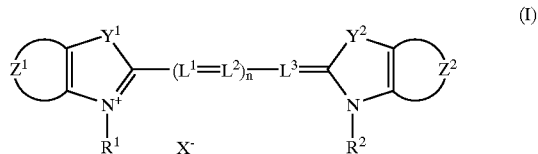

(I)

wherein $R^1$ and $R^2$ each independently represents an aliphatic group or an aromatic group; $Y^1$ and $Y^2$ each independently represents a sulfur atom, an oxygen atom, $C(R^3)R^4$, a selenium atom or a tellurium atom, and $R^3$ and $R^4$ each independently represents a hydrogen atom, an aliphatic group or an aromatic group, provided that $R^3$ and $R^4$ are atomic groups which form a ring by bonding with each other; the aliphatic group and the aromatic group are defined in the same way as the aliphatic group and the aromatic group represented by $R^1$ or $R^2$ in the general formula (I); $Z^1$ represents an atomic group forming an aromatic heterocyclic ring or an aromatic ring formed by condensation of heterocyclic rings, wherein the heterocyclic ring may have a substituent; $Z^2$ represents an atomic group forming an aromatic ring or a heterocyclic ring, wherein the aromatic ring and the heterocyclic ring each may have a substituent; $L^1$, $L^2$ and $L^3$ each independently represents a methine group which may or may not have a substituent, wherein when $L^1$, $L^2$ and $L^3$ each is a methine group having a substituent, the substituents may bond to form an unsaturated aliphatic ring or an unsaturated heterocyclic ring; n represents 0, 1, 2 or 3; and $X^-$ represents a group capable of forming an anion.

2. A photopolymerizable composition as claimed in claim 1, wherein a content of said polymerizable compound having an ethylenic unsaturated bond is from 10 to 99% by weight of the total weight of said photopolymerizable composition.

3. A photopolymerizable composition as claimed in claim 1, wherein a content of said compound represented by the general formula (I) is from 0.01 to 5 parts by weight per 1 part by weight of said radical generator.

4. A photopolymerizable composition as claimed in claim 1, wherein said radical generator is an organic boron compound.

5. A photopolymerizable composition as claimed in claim 4, wherein said organic boron compound is a compound represented by the following general formula (A):

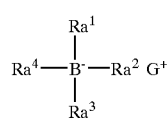

(A)

wherein $R_a^1$, $R_a^2$, $R_a^3$ and $R_a^4$ each independently represents an aliphatic group, an aromatic group, a heterocyclic group or $Si(R_a^5)(R_a^6)—R_a^7$, wherein $R_a^5$, $R_a^6$ and $R_a^7$ each independently represents an aliphatic group or an aromatic group; and $G^+$ represents a group capable of forming a cation.

6. A photopolymerizable composition as claimed in claim 1, wherein a content of said radical generator is from 0.01 to 20% by weight of a content of said polymerizable compound having an ethylenic unsaturated bond.

7. A photopolymerizable composition as claimed in claim 1, wherein said photopolymerizable composition further comprises a binder.

8. A photopolymerizable composition as claimed in claim 7, wherein a content of said binder is from 5 to 95% by weight of a total solid content.

9. A recording material comprising a support having thereon a recording layer, said recording layer containing a color forming component A, a color forming component B having a site that causes said coloring agent A to form color upon reacting therewith, and a photopolymerizable composition, said photopolymerizable composition comprising a polymerizable compound having an ethylenic unsaturated bond, a compound represented by the following general formula (I), and a radical generator capable of forming a radical by the action of said compound and said radical generator upon each other:

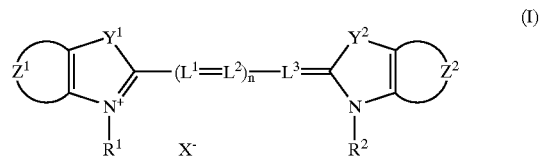

(I)

wherein $R^1$ and $R^2$ each independently represents an aliphatic group or an aromatic group; $Y^1$ and $Y^2$ each independently represents a sulfur atom, an oxygen atom, $C(R^3)R^4$, a selenium atom or a tellurium atom, and $R^3$ and $R^4$ each independently represents a hydrogen atom, an aliphatic group or an aromatic group, provided that $R^3$ and $R^4$ are atomic groups which form a ring by bonding with each other; the aliphatic group and the aromatic group are defined in the same way as the aliphatic group and the aromatic group represented by $R^1$ or $R^2$ in the general formula (I); $Z^1$ represents an atomic group forming an aromatic heterocyclic ring or an aromatic ring formed by condensation of heterocyclic rings, wherein the heterocyclic ring may have a substituent; $Z^2$ represents an atomic group forming an aromatic ring or a heterocyclic ring, wherein the aromatic ring and the heterocyclic ring each may have a substituent; $L^1$, $L^2$ and $L^3$ each independently represents a methine group which may or may not have a substituent, wherein when $L^1$, $L^2$ and $L^3$ each is a methine group having a substituent, the substituents may bond to form an unsaturated aliphatic ring or an unsaturated heterocyclic ring; n represents 0, 1, 2 or 3; and $X^-$ represents a group capable of forming an anion.

10. A recording material as claimed in claim 9, wherein a content of said photopolymerizable composition in said recording layer is from 0.1 to 50 g/m².

11. A recording material as claimed in claim 9, wherein at least one of said polymerizable compound having an ethylenic unsaturated bond is said color forming component B.

12. A recording material as claimed in claim 11, wherein said color forming component B is 3-halo-4-hydroxybenzoic acid represented by the following general formula:

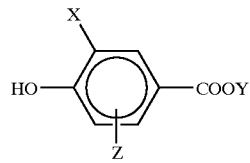

wherein X represents a halogen atom, Y represents a monovalent group having a polymerizable ethylene group, and Z represents a hydrogen atom, an alkyl group or an alkoxy group.

13. A recording material as claimed in claim 9, wherein said polymerizable compound having an ethylenic unsaturated bond is a coloring suppressing compound having a site that suppresses a reaction between said color forming component A and said color forming component B in the same molecule.

14. A recording material as claimed in claim 13, wherein said recording layer contains heat-responsive microcapsules, and said color forming component A is contained in said microcapsules.

15. A recording material as claimed in claim 9, wherein said recording layer contains heat-responsive microcapsules, and said color forming component A is contained in said microcapsules.

16. A recording material as claimed in claim 9, wherein said color forming component A is an electron donating dye precursor, and the color forming component B is an electron accepting compound.

17. A recording material as claimed in claim 16, wherein a content of said electron donating dye precursor in said recording layer is from 0.05 to 5 g/m$^2$.

18. A recording material as claimed in claim 9, wherein said color forming component A is a diazo compound, and the color forming component B is a coupler compound.

19. A recording material as claimed in claim 18, wherein a content of said diazo compound in said recording layer is from 0.02 to 5.0 g/m$^2$.

20. A recording material as claimed in claim 9, wherein said recording layer comprises a multi-layer structure comprising a plurality of superposed layers, and said layers are sensitive to light having different center wavelengths and form different colors.

* * * * *